(12) United States Patent
Kikitsu et al.

(10) Patent No.: US 11,513,173 B2
(45) Date of Patent: Nov. 29, 2022

(54) MAGNETIC SENSOR AND INSPECTION DEVICE

(71) Applicant: KABUSHIKI KAISHA TOSHIBA, Tokyo (JP)

(72) Inventors: Akira Kikitsu, Kanagawa (JP); Satoshi Shirotori, Kanagawa (JP); Yoshihiro Higashi, Ishikawa (JP); Yoshinari Kurosaki, Kanagawa (JP); Hitoshi Iwasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/410,717

(22) Filed: Aug. 24, 2021

(65) Prior Publication Data

US 2022/0221534 A1 Jul. 14, 2022

(30) Foreign Application Priority Data

Jan. 13, 2021 (JP) .............................. JP2021-003266

(51) Int. Cl.
*G01R 33/00* (2006.01)
*G01R 33/09* (2006.01)

(52) U.S. Cl.
CPC .......... *G01R 33/091* (2013.01); *G01R 33/093* (2013.01); *G01R 33/098* (2013.01)

(58) Field of Classification Search
CPC ... G01R 33/093; G01R 33/091; G01R 33/098
See application file for complete search history.

(56) References Cited

U.S. PATENT DOCUMENTS

| 2017/0363606 A1 | 12/2017 | Kikitsu et al. |
| 2018/0271395 A1 | 9/2018 | Iwasaki et al. |
| 2019/0369172 A1 | 12/2019 | Kikitsu et al. |
| 2020/0371168 A1* | 11/2020 | Van Der Wiel .... G01R 33/0011 |

FOREIGN PATENT DOCUMENTS

| JP | 2018-155719 A | 10/2018 |
| JP | 2019-207167 A | 12/2019 |
| JP | 6668176 B2 | 3/2020 |

* cited by examiner

*Primary Examiner* — Alesa Allgood
(74) *Attorney, Agent, or Firm* — Finnegan, Henderson, Farabow, Garrett & Dunner, LLP

(57) ABSTRACT

According to one embodiment, a magnetic sensor includes a base body, a magnetic member, and an element part. The base body includes a base body end portion. A direction from the base body toward the magnetic member is along a first direction. The element part includes a first magnetic element and a second magnetic element. A position of the first magnetic element and a position of the second magnetic element in a second direction are between a position of the base body end portion in the second direction and a position of the magnetic member in the second direction. The second direction crosses the first direction. A first distance along the second direction between the base body end portion and the element part is greater than a second distance along the second direction between the element part and the magnetic member.

20 Claims, 16 Drawing Sheets

Hsig=0

+Hsig

-Hsig

MAGNETIC SENSOR AND INSPECTION DEVICE

CROSS-REFERENCE TO RELATED APPLICATIONS

This application is based upon and claims the benefit of priority from Japanese Patent Application No. 2021-003266, filed on Jan. 13, 2021; the entire contents of which are incorporated herein by reference.

FIELD

Embodiments described herein relate generally to a magnetic sensor and an inspection device.

BACKGROUND

There is a magnetic sensor that uses a magnetic layer. There is an inspection device that uses the magnetic sensor. It is desirable to improve the characteristics of the magnetic sensor.

DETAILED DESCRIPTION

Figure 1A:
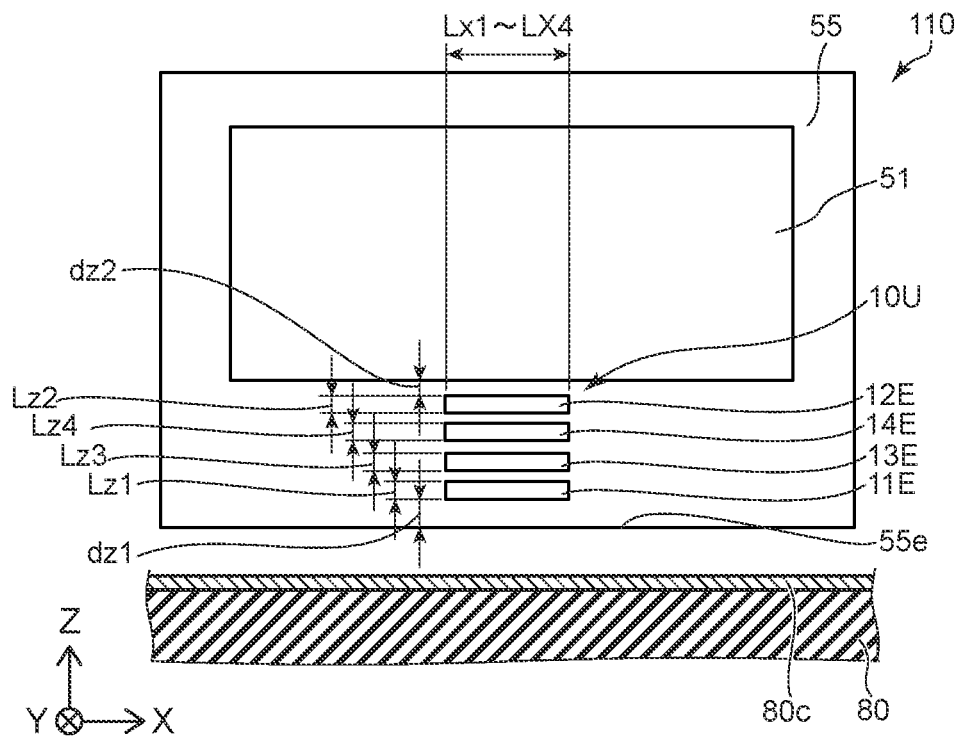
FIGS. 1A and 1B are schematic views illustrating a magnetic sensor according to a first embodiment.

According to one embodiment, a magnetic sensor includes a base body, a magnetic member, and an element part. The base body includes a base body end portion. A direction from the base body toward the magnetic member is along a first direction. The element part includes a first magnetic element and a second magnetic element. A position of the first magnetic element and a position of the second magnetic element in a second direction are between a position of the base body end portion in the second direction and a position of the magnetic member in the second direction. The second direction crosses the first direction. A first distance along the second direction between the base body end portion and the element part is greater than a second distance along the second direction between the element part and the magnetic member.

According to one embodiment, an inspection device includes the magnetic sensor described above, and a processor configured to process a signal output from the magnetic sensor.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
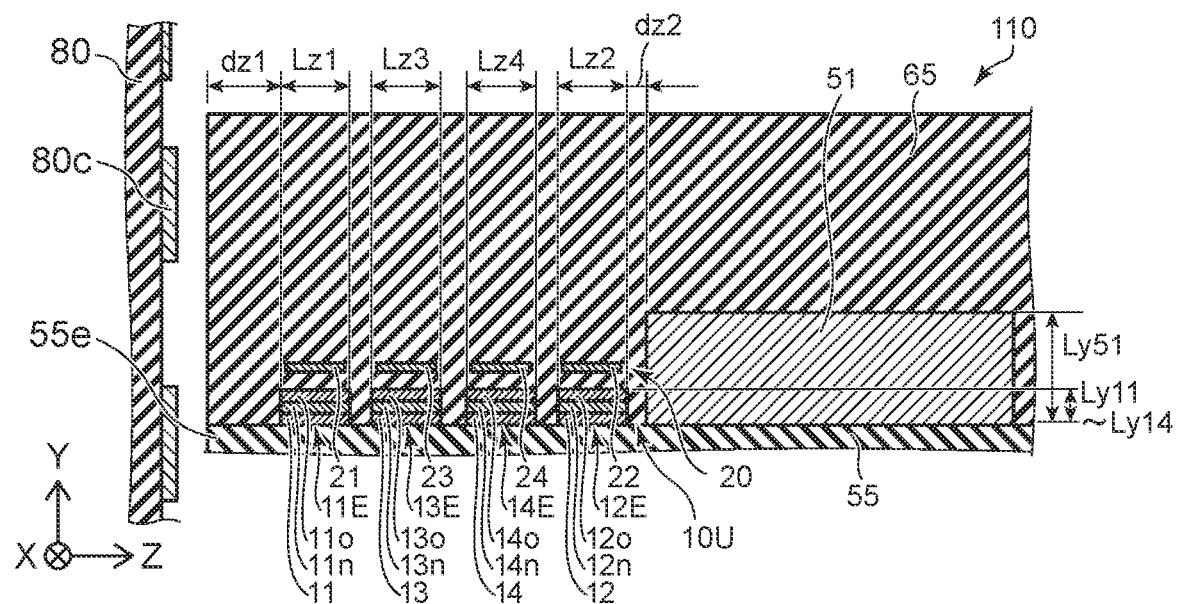

FIGS. 1A and 1B are schematic views illustrating a magnetic sensor according to a first embodiment.

FIG. 1A is a plan view. FIG. 1B is a cross-sectional view.

As shown in FIGS. 1A and 1B, the magnetic sensor 110 according to the embodiment includes a base body 55, a magnetic member 51, and an element part 10U.

The base body 55 includes a base body end portion 55e. The direction from the base body 55 toward the magnetic member 51 is along a first direction. The first direction is taken as a Y-axis direction. One direction perpendicular to the Y-axis direction is taken as a Z-axis direction. A direction perpendicular to the Y-axis direction and the Z-axis direction is taken as an X-axis direction. One direction that crosses the first direction is taken as a second direction. The second direction is, for example, the Z-axis direction.

The element part 10U includes a first magnetic element 11E and a second magnetic element 12E. In the example, the element part 10U further includes a third magnetic element 13E and a fourth magnetic element 14E.

According to the embodiment, the position of the element part 10U in the second direction (e.g., the Z-axis direction) recited above is between the position of the base body end portion 55e in the second direction and the position of the magnetic member 51 in the second direction. For example, the position of the first magnetic element 11E and the position of the second magnetic element 12E in the second direction (e.g., the Z-axis direction) are between the position of the base body end portion 55e in the second direction and the position of the magnetic member 51 in the second direction. The direction from the first magnetic element 11E toward the third magnetic element 13E is along the second direction. The direction from the first magnetic element 11E toward the fourth magnetic element 14E is along the second direction. For example, the multiple magnetic elements are arranged along the second direction (the Z-axis direction). The sequence of the arrangement of the multiple magnetic elements is arbitrary.

As shown in FIGS. 1A and 1B, the magnetic sensor 110 is configured to face a detection object 80. The detection object 80 is, for example, an inspection object. The detection object 80 includes, for example, at least an inspection conductive member 80c such as a metal, etc. For example, the magnetic sensor 110 is configured to detect a magnetic field (a current magnetic field) caused by a current that flows in the inspection conductive member 80c.

For example, the magnetic flux of the current magnetic field is concentrated by the magnetic member 51. The magnetic flux that is concentrated by the magnetic member 51 is efficiently applied to the element part 10U (the multiple magnetic elements). For example, the magnetic member 51 functions as a MFC (Magnetic Flux Concentrator).

In the example as shown in FIG. 1B, at least one of the multiple magnetic elements (e.g., the first magnetic element 11E) overlaps the magnetic member 51 in the second direction (the Z-axis direction).

As shown in FIG. 1B, the first magnetic element 11E includes a first magnetic layer 11, a first counter magnetic layer 11o, and a first nonmagnetic layer 11n. The first nonmagnetic layer 11n is located between the first magnetic layer 11 and the first counter magnetic layer 11o. The second magnetic element 12E includes a second magnetic layer 12, a second counter magnetic layer 12o, and a second nonmagnetic layer 12n. The second nonmagnetic layer 12n is located between the second magnetic layer 12 and the second counter magnetic layer 12o. The third magnetic element 13E includes a third magnetic layer 13, a third counter magnetic layer 13o, and a third nonmagnetic layer 13n. The third nonmagnetic layer 13n is located between the third magnetic layer 13 and the third counter magnetic layer 13o. The fourth magnetic element 14E includes a fourth magnetic layer 14, a fourth counter magnetic layer 14o, and a fourth nonmagnetic layer 14n. The fourth nonmagnetic layer 14n is located between the fourth magnetic layer 14 and the fourth counter magnetic layer 14o.

The first to fourth magnetic layers 11 to 14 and the first to fourth counter magnetic layers 11o to 14o include at least one selected from the group consisting of Fe, Co, and Ni. These magnetic layers are, for example, ferromagnetic layers. The first to fourth nonmagnetic layers 11n to 14n include, for example, a conductive material such as Cu, etc. The first to fourth magnetic elements 11E to 14E are, for example, GMR (Giant Magneto Resistance) elements. The first to fourth magnetic elements 11E to 14E may be, for example, TMR (Tunnel Magneto Resistance) elements.

For example, the electrical resistances of the first to fourth magnetic elements 11E to 14E change according to the magnetic field from the detection object 80. For example, in each of these magnetic elements, the orientation of the magnetization of at least one of the magnetic layer or the counter magnetic layer changes according to the magnetic field. The angle between the magnetization of the magnetic layer and the magnetization of the counter magnetic layer changes due to the change of the orientation of the magnetization. The electrical resistances of the first to fourth magnetic elements 11E to 14E change according to the changes of the angles. The magnetic field from the detection object 80 is detected by detecting the change of the electrical resistance.

According to the embodiment, the magnetic field from the detection object 80 is concentrated by the magnetic member 51; and the concentrated magnetic field is applied to the first to fourth magnetic elements 11E to 14E. Higher sensitivity is obtained thereby. A magnetic sensor with improved sensing characteristics can be provided.

According to the embodiment as described above, for example, the position of the element part 10U in the Z-axis direction is between the position of the base body end portion 55e in the Z-axis direction and the position of the magnetic member 51 in the Z-axis direction. For example, the element part 10U can be positioned between the magnetic member 51 and the inspection conductive member 80c of the detection object 80. Thereby, the magnetic field (the current magnetic field) that is caused by the current flowing in the inspection conductive member 80c can be detected with high resolution.

An example of simulation results of the characteristics of the magnetic sensor will now be described. In the following example, a case where the element part 10U includes one magnetic element (the first magnetic element 11E) will be described.

FIGS. 2A to 2F are schematic views illustrating models of the simulation of the magnetic sensor.

Figure 2A:
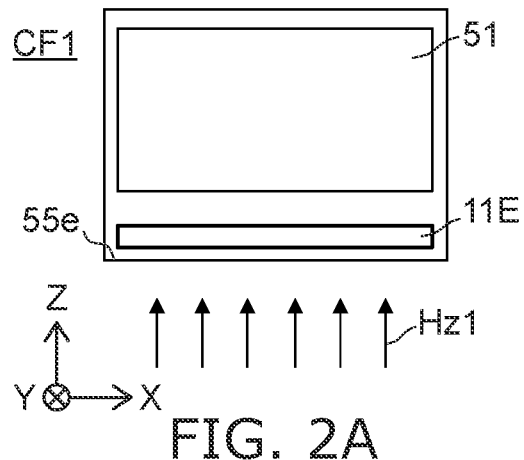
FIGS. 2A to 2F are schematic views illustrating models of the simulation of the magnetic sensor.
Figure 2D:
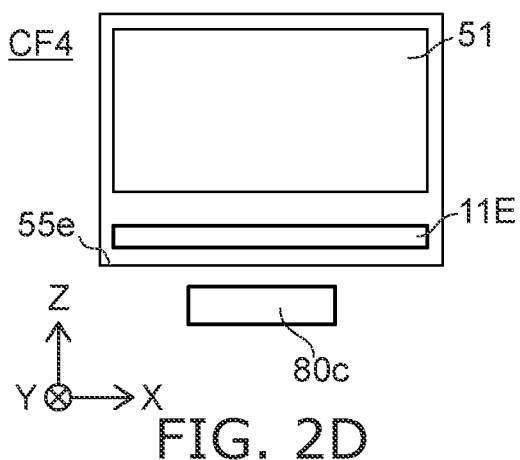
Figure 2B:
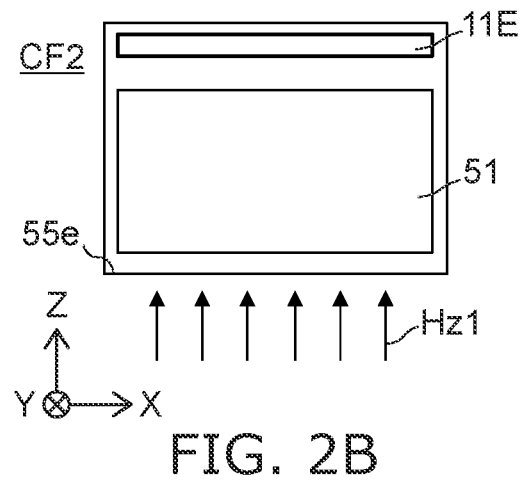
Figure 2E:
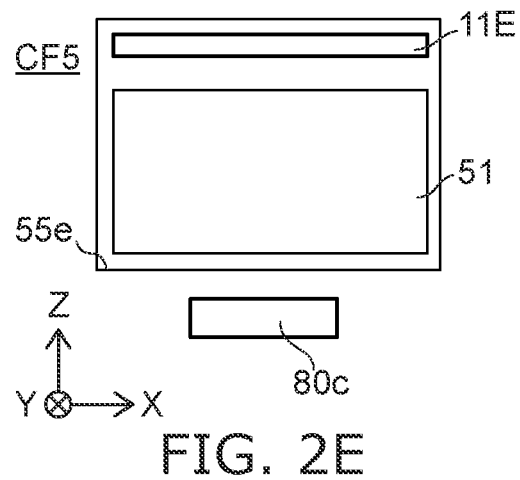
Figure 2C:
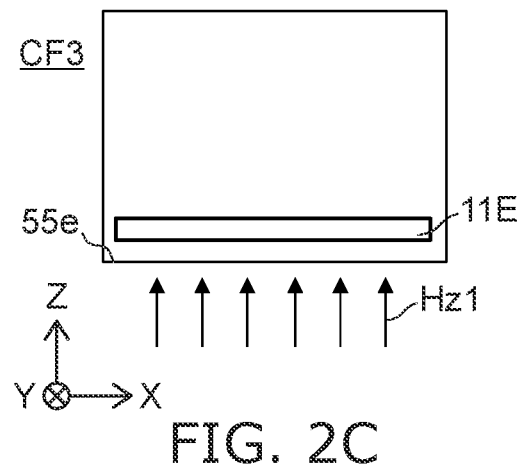
Figure 2F:
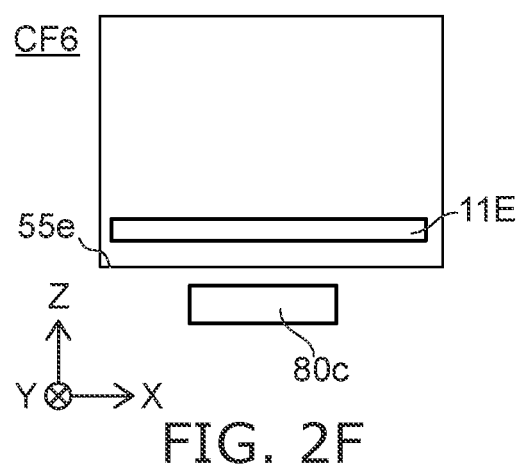

In a first model CF1 and a fourth model CF4 as shown in FIGS. 2A and 2D, the first magnetic element 11E (the element part 10U) is between the base body end portion 55e and the magnetic member 51 in the Z-axis direction. In a second model CF2 and a fifth model CF5 as shown in FIGS. 2B and 2E, the magnetic member 51 is between the base body end portion 55e and the first magnetic element 11E (the element part 10U) in the Z-axis direction. In a third model CF3 and a sixth model CF6 as shown in FIGS. 2C and 2F, the magnetic member 51 is not included.

In the first to third models CF1 to CF3, a uniform magnetic field Hz1 is applied to the first magnetic element 11E. In the fourth to sixth models CF4 to CF6, a current flows in the inspection conductive member 80c; and a current magnetic field caused by the current is applied to the first magnetic element 11E. In the example, the distance in the Z-axis direction between the inspection conductive member 80c and the first magnetic element 11E is 20 μm. The length along the Z-axis direction of the first magnetic element 11E is 5 μm. The length in the Z-axis direction of the magnetic member 51 is 100 μm.

Figure 3A:
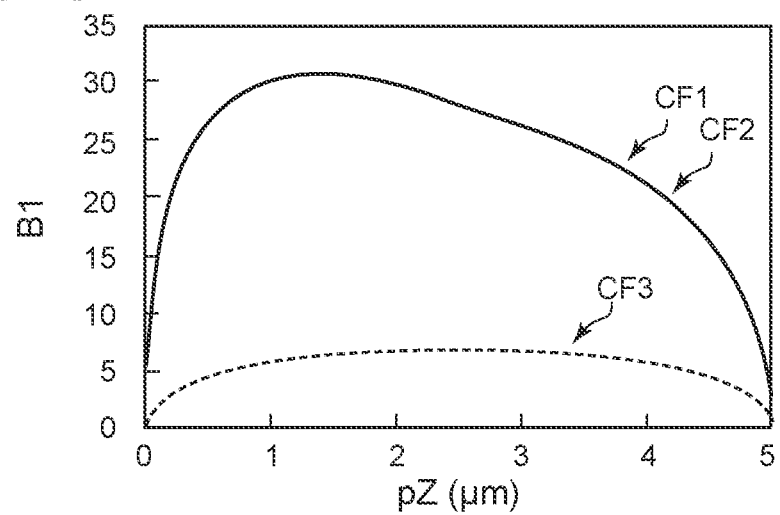
FIGS. 3A and 3B are graphs illustrating simulation results of the characteristics of the magnetic sensor.
Figure 3B:
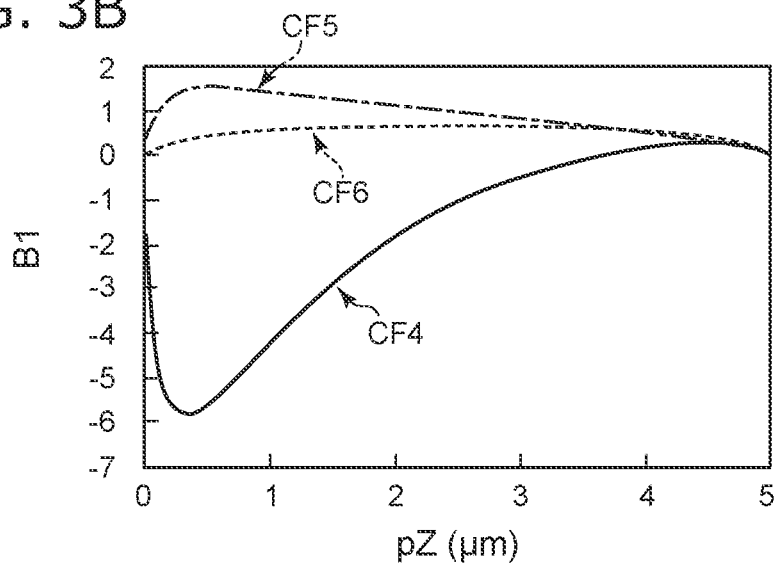

FIGS. 3A and 3B are graphs illustrating simulation results of the characteristics of the magnetic sensor.

In these figures, the horizontal axis is a position pZ in the Z-axis direction inside the first magnetic element 11E. The vertical axis is a magnetic flux density B1 (a relative value) at the position of the first magnetic element 11E.

When the uniform magnetic field Hz1 is applied to the first magnetic element 11E as shown in FIG. 3A, the magnetic flux density B1 is higher in the first and second models CF1 and CF2 that include the magnetic member 51 than in the third model CF3 that does not include the magnetic member 51. In other words, high sensitivity is obtained. The distribution of the magnetic flux density B1 of the first model CF1 is the same as the distribution of the magnetic flux density B1 of the second model CF2.

When a current magnetic field is applied to the first magnetic element 11E as shown in FIG. 3B, the maximum value of the absolute value of the magnetic flux density B1 of the fifth model CF5 is greater than the maximum value of the absolute value of the magnetic flux density B1 of the sixth model CF6. The maximum value of the absolute value of the magnetic flux density B1 of the fourth model CF4 is greater than the maximum value of the absolute value of the magnetic flux density B1 of the fifth model CF5. A particularly high sensitivity is obtained in the fourth model CF4. In the fourth model CF4, the characteristics of the inspection conductive member 80c can be detected with high sensitivity. According to the embodiment, a magnetic sensor with improved characteristics can be provided.

A current magnetic field from the inspection conductive member 80c can be detected with high sensitivity not only by one magnetic element but also by multiple magnetic elements when the multiple magnetic elements are located between the base body end portion 55e and the magnetic member 51.

As described below, by processing a signal detected from the multiple magnetic elements, it is possible to further reduce noise and detect with higher sensitivity. For example, as described below, the multiple magnetic elements have a bridge connection. In such a case, it is more favorable for the magnetic flux density of the external magnetic field (e.g., a current magnetic field) applied to the multiple magnetic elements to be uniform at the positions of the multiple magnetic elements. From this perspective, it is favorable for the position of the element part 10U (the positions of the multiple magnetic elements) to be suitably set.

For example, as shown in FIG. 1B, the distance along the second direction (e.g., the Z-axis direction) between the base body end portion 55e and the element part 10U is taken as a first distance dz1. The distance along the second direction between the element part 10U and the magnetic member 51 is taken as a second distance dz2. In the example, the first distance dz1 corresponds to the distance along the second direction between the base body end portion 55e and the first magnetic element 11E. The second distance dz2 corresponds to the distance along the second direction between the second magnetic element 12E and the magnetic member 51. According to the embodiment, the first distance dz1 is greater than the second distance dz2. Thereby, the magnetic flux density at the positions of the multiple magnetic elements becomes uniform.

An example of magnetic properties at the positions of the multiple magnetic elements will now be described.

Figure 4:
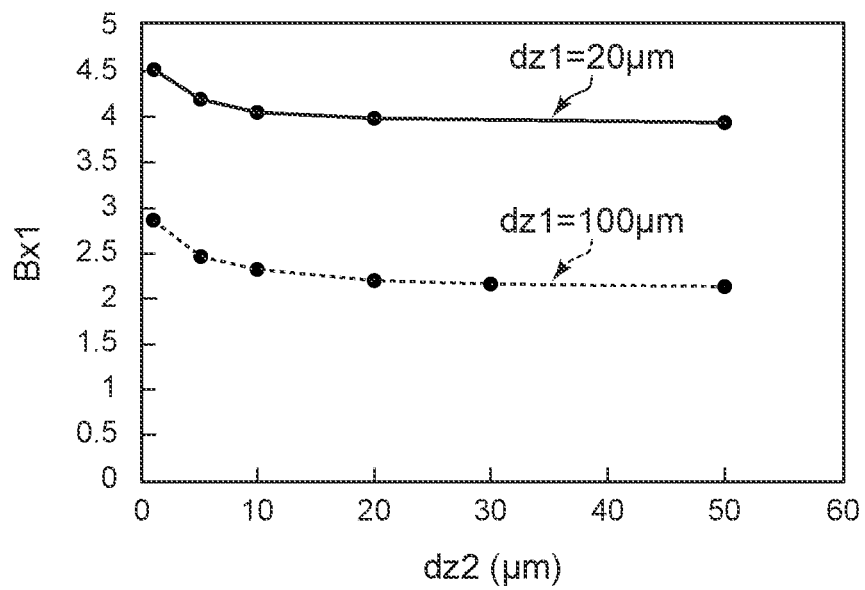
FIG. 4 is a graph illustrating simulation results of characteristics of the magnetic sensor.

FIG. 4 is a graph illustrating simulation results of characteristics of the magnetic sensor.

The horizontal axis of FIG. 4 is the second distance dz2. The vertical axis is a parameter Bx1. The parameter Bx1 is a relative value that corresponds to the magnitude of the increase of the sensitivity due to the magnetic member 51 (a gain of the sensitivity). The parameter Bx1 is the ratio of the average value of the magnetic flux densities of the first to fourth magnetic elements 11E to 14E in the Z-axis direction when the magnetic member 51 is included to the average value of the magnetic flux densities of the first to fourth magnetic elements 11E to 14E in the Z-axis direction when the magnetic member 51 is not included. It is favorable for the parameter Bx1 to be greater than 1. FIG. 4 illustrates the characteristics of Bx1 when the first distance dz1 is 20 μm and 100 μm.

As shown in FIG. 4, Bx1 that is greater than 2 is obtained when the second distance dz2 is not more than 50 μm. The Bx1 increases when the second distance dz2 is not more than 10 μm. It is favorable for the second distance dz2 to be not more than 10 μm. The second distance dz2 may be, for example, not more than ½ of the length in the Z-axis direction of the magnetic member 51.

Figure 5:
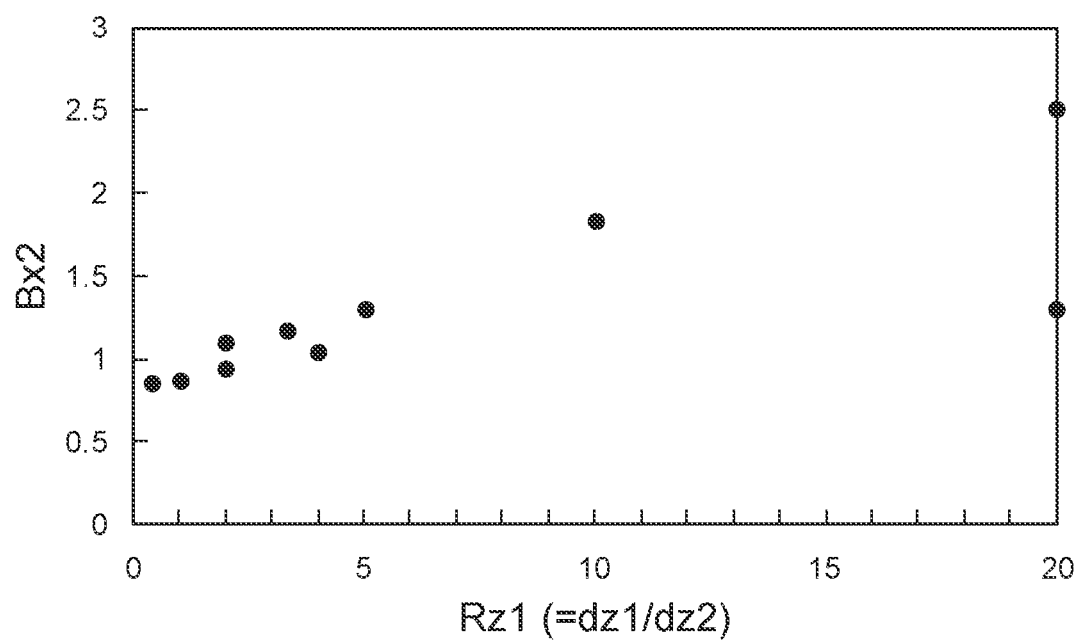
FIG. 5 is a graph illustrating simulation results of a characteristic of the magnetic sensor.

FIG. 5 is a graph illustrating simulation results of a characteristic of the magnetic sensor.

The horizontal axis of FIG. 5 is a ratio Rz1. The ratio Rz1 is the ratio of the first distance dz1 to the second distance dz2. The vertical axis is a fluctuation parameter Bx2. The fluctuation parameter Bx2 corresponds to the reciprocal of the magnitude of the fluctuation of the average magnetic flux densities of the first to fourth magnetic elements 11E to 14E. The first to fourth magnetic elements 11E to 14E respectively have average magnetic flux densities (first to fourth average magnetic flux densities). The fluctuation value is represented by the reciprocal of the ratio of the difference between the maximum value and the minimum value of the first to fourth average magnetic flux densities to the average value of the first to fourth average magnetic flux densities. The fluctuation parameter Bx2 is the ratio of the fluctuation value when the magnetic member 51 is included to the fluctuation value when the magnetic member 51 is not included. It is favorable for the fluctuation parameter Bx2 to be greater than 1.

As shown in FIG. 5, the fluctuation parameter Bx2 is not less than about 1 when the ratio Rz1 is greater than 1. According to the embodiment, it is favorable for the first distance dz1 to be greater than the second distance dz2. When the ratio Rz1 is not less than 2, the fluctuation parameter Bx2 is greater than 1. When the ratio Rz1 is not less than 2, the fluctuation is small and is equal to or greater than when the magnetic member 51 is not included. When the ratio Rz1 is not less than 4, the fluctuation is reliably less than when the magnetic member 51 is not included. The magnetic flux density at the positions of the multiple magnetic elements becomes uniform.

For example, it is favorable for the first distance dz1 to be not less than 4 times the second distance dz2. The fluctuation of the magnetic flux density in the multiple magnetic elements can be reduced thereby.

For example, it is favorable for the first distance dz1 to be not more than 100 times the second distance dz2. For example, a sufficiently high sensitivity is easily obtained thereby.

Examples of the multiple magnetic elements will now be described. A direction that crosses a plane (the Y-Z plane) that includes the first and second directions is taken as a third direction. The third direction is, for example, the X-axis direction.

As shown in FIG. 1A, the length along the third direction (e.g., the X-axis direction) of the first magnetic element 11E is taken as a length Lx1. For example, the length Lx1 is greater than a length Lz1 along the second direction (the Z-axis direction) of the first magnetic element 11E. The length along the third direction (e.g., the X-axis direction) of the second magnetic element 12E is taken as a length Lx2. For example, the length Lx2 is greater than a length Lz2 along the second direction (the Z-axis direction) of the second magnetic element 12E. The length along the third direction (e.g., the X-axis direction) of the third magnetic element 13E is taken as a length Lx3. For example, the length Lx3 is greater than a length Lz3 along the second direction (the Z-axis direction) of the third magnetic element 13E. The length along the third direction (e.g., the X-axis direction) of the fourth magnetic element 14E is taken as a length Lx4. For example, the length Lx4 is greater than a length Lz4 along the second direction (the Z-axis direction) of the fourth magnetic element 14E. Because the lengths Lz1 to Lz4 are short, for example, the distance between the magnetic member 51 and the detection object 80 can be short. A higher spatial resolution is obtained.

For example, when the length Lx1 is equal to the length Lz1 the maximum value of the absolute value of the magnetic flux density B1 shown in FIG. 3B is about 0.3. It is difficult to obtain high sensitivity. For example, in a reference example in which the multiple magnetic elements extend along the Z-axis direction and the multiple magnetic elements are arranged along the X-axis direction, the maximum value of the absolute value of the magnetic flux density B1 is small. It is difficult to obtain high sensitivity. When the multiple magnetic elements extend along the Z-axis direction, the distance between the base body end portion 55e and the magnetic member 51 increases, and as a result, the distance between the magnetic member 51 and the inspection conductive member 80c of the detection object 80 is longer. Therefore, it is difficult for the magnetic member 51 to concentrate the current magnetic field from the inspection conductive member 80c.

For example, it is favorable for the length Lx1 to be not less than 5 times the length Lz1. For example, it is favorable for the length Lx2 to be not less than 5 times the length Lz2. For example, it is favorable for the length Lx3 to be not less than 5 times the length Lz3. For example, it is favorable for the length Lx4 to be not less than 5 times the length Lz4. By such aspect ratios, the orientations of the magnetizations in the initial state are easily aligned for the magnetic layer and the counter magnetic layer of each of the multiple magnetic elements. More stable detection is possible.

As shown in FIG. 1B, the length along the first direction (the Y-axis direction) of the magnetic member 51 is taken as a length Ly51 (the thickness). It is favorable for the length Ly51 to be greater than a length Ly11 (the thickness) along the first direction of the first magnetic element 11E. It is favorable for the length Ly51 to be greater than a length Ly12 (the thickness) along the first direction of the second magnetic element 12E. It is favorable for the length Ly51 to be greater than a length Ly13 (the thickness) along the first direction of the third magnetic element 13E. It is favorable for the length Ly51 to be greater than a length Ly14 (the thickness) along the first direction of the fourth magnetic element 14E. Because the magnetic member 51 is thick, the magnetic field from the detection object 80 can be more effectively concentrated, and the concentrated magnetic field can be effectively applied to the multiple magnetic elements. For example, higher sensitivity is easily obtained. For example, the length Ly51 is not less than 2 times the length Ly11. The length Ly51 may be not more than 100 times the length Ly11.

As shown in FIG. 1B, the magnetic sensor 110 may include an insulating member 65. For example, a portion of the insulating member 65 is located between the multiple magnetic elements and the magnetic member 51. For example, the multiple magnetic elements are located between the base body 55 and the insulating member 65. For example, connection members can be provided between the base body 55 and the insulating member 65. By providing the insulating member 65, stable insulation of the conductive member is obtained.

As shown in FIG. 1B, the element part 10U may include a conductive member 20. For example, the conductive member 20 includes first to fourth corresponding portions 21 to 24. The first corresponding portion 21 corresponds to the first magnetic element 11E. The second corresponding portion 22 corresponds to the second magnetic element 12E. The third corresponding portion 23 corresponds to the third magnetic element 13E. The fourth corresponding portion 24 corresponds to the fourth magnetic element 14E.

The first to fourth magnetic elements 11E to 14E extend along the third direction (e.g., the X-axis direction). The first to fourth corresponding portions 21 to 24 respectively overlap the first to fourth magnetic elements 11E to 14E in a direction that crosses the direction (e.g., the third direction) in which the first to fourth magnetic elements 11E to 14E extend. For example, the first corresponding portion 21 overlaps the first magnetic element 11E in the first direction (the Y-axis direction). The second corresponding portion 22 overlaps the second magnetic element 12E in the first direction. The third corresponding portion 23 overlaps the third magnetic element 13E in the first direction. The fourth corresponding portion 24 overlaps the fourth magnetic element 14E in the first direction.

As described below, a first current that includes an alternating current component is supplied to the conductive member 20. By using the first current, the magnetic field from the detection object 80 can be detected with higher accuracy.

An example of the electrical connection of the multiple magnetic elements and the conductive member 20 will now be described.

Figure 6:
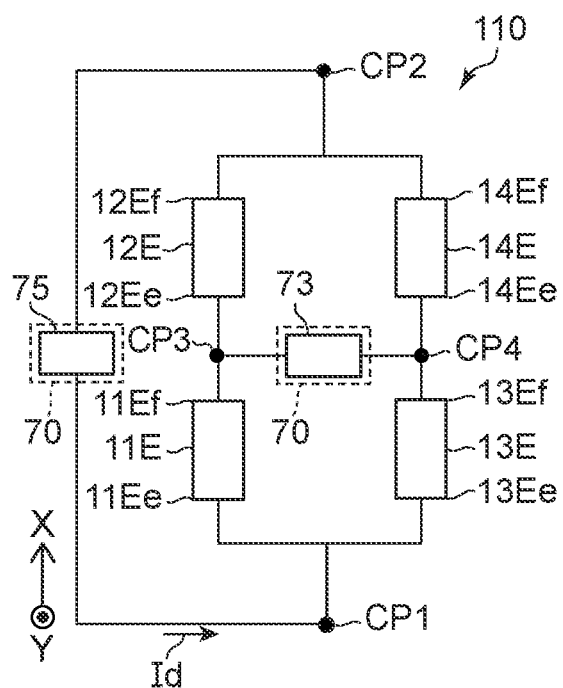
FIG. 6 is a schematic view illustrating the magnetic sensor according to the first embodiment.

FIG. 6 is a schematic view illustrating the magnetic sensor according to the first embodiment.

FIG. 6 shows the example of the electrical connection of the first to fourth magnetic elements 11E to 14E. In the illustration of FIG. 6, the spatial arrangement of the first to fourth magnetic elements 11E to 14E is modified from the example of FIG. 1A so that the electrical connectional relationship is easy to understand.

As shown in FIG. 6, the first magnetic element 11E includes one end portion 11Ee and another end portion 11Ef. The direction from the one end portion 11Ee toward the other end portion 11Ef is along the X-axis direction. The second magnetic element 12E includes one end portion 12Ee and another end portion 12Ef. The direction from the one end portion 12Ee toward the other end portion 12Ef is along the X-axis direction. The third magnetic element 13E includes one end portion 13Ee and another end portion 13Ef. The direction from the one end portion 13Ee toward the other end portion 13Ef is along the X-axis direction. The fourth magnetic element 14E includes one end portion 14Ee and another end portion 14Ef. The direction from the one end portion 14Ee toward the other end portion 14Ef is along the X-axis direction. The one end portion 11Ee and the other end portion 11Ef may be interchanged with each other. The one end portion 12Ee and the other end portion 12Ef may be interchanged with each other. The one end portion 13Ee and the other end portion 13Ef may be interchanged with each other. The one end portion 14Ee and the other end portion 14Ef may be interchanged with each other.

As shown in FIG. 6, the other end portion 11Ef of the first magnetic element 11E is electrically connected with the one end portion 12Ee of the second magnetic element 12E. The one end portion 11Ee of the first magnetic element 11E is electrically connected with the one end portion 13Ee of the third magnetic element 13E. The other end portion 13Ef of the third magnetic element 13E is electrically connected with the one end portion 14Ee of the fourth magnetic element 14E. The other end portion 12Ef of the second magnetic element 12E is electrically connected with the other end portion 14Ef of the fourth magnetic element 14E. Thus, the first to fourth magnetic elements 11E to 14E have a bridge connection.

As shown in FIG. 6, the magnetic sensor 110 may further include an element current circuit 75. The element current circuit 75 is configured to supply an element current Id between a first connection point CP1 and a second connection point CP2, in which the first connection point CP1 is between the one end portion 11Ee of the first magnetic element 11E and the one end portion 13Ee of the third magnetic element 13E, and the second connection point CP2 is between the other end portion 12Ef of the second magnetic element 12E and the other end portion 14Ef of the fourth magnetic element 14E.

As shown in FIG. 6, the magnetic sensor 110 may further include a detection circuit 73. The detection circuit 73 is configured to detect the change of the potential between a third connection point CP3 and a fourth connection point CP4, in which the third connection point CP3 is between the other end portion 11Ef of the first magnetic element 11E and the one end portion 12Ee of the second magnetic element 12E, and the fourth connection point CP4 is between the other end portion 13Ef of the third magnetic element 13E and the one end portion 14Ee of the fourth magnetic element 14E.

Figure 7A:
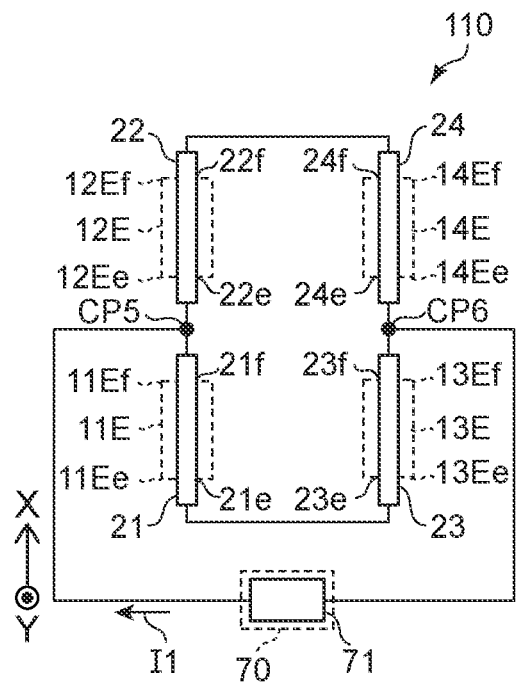
FIGS. 7A to 7D are schematic views illustrating magnetic sensors according to the first embodiment.
Figure 7B:
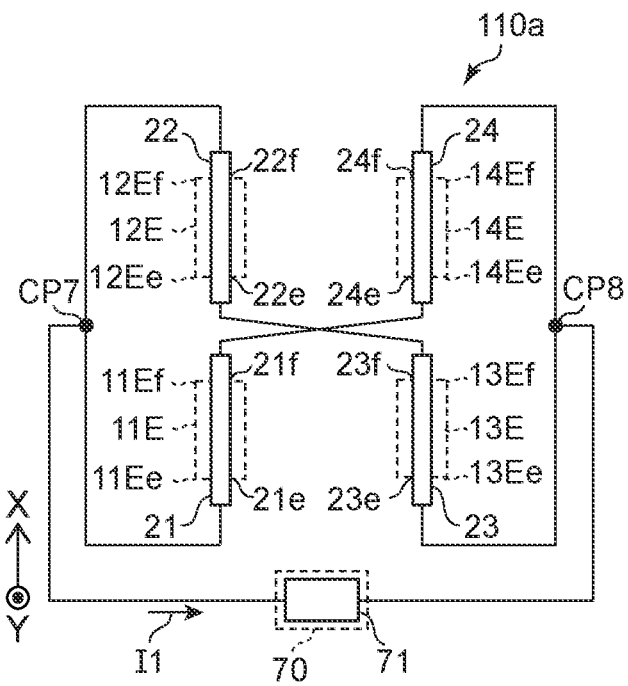
Figure 7C:
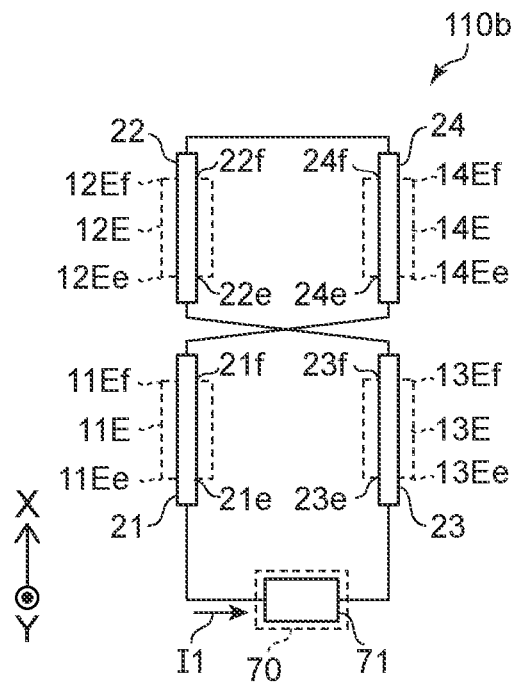
Figure 7D:
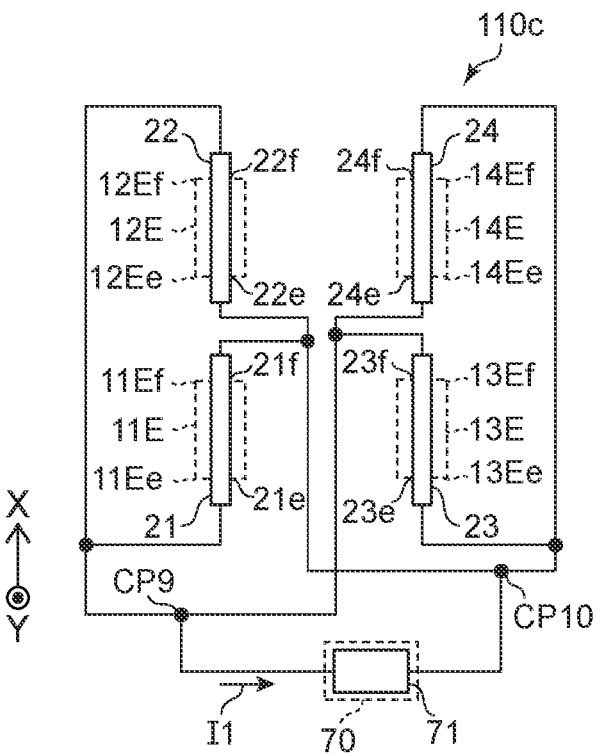

FIGS. 7A to 7D are schematic views illustrating magnetic sensors according to the first embodiment. FIGS. 7B to 7D show several examples of the electrical connection of the conductive member 20. In the illustrations of FIGS. 7A to 7D, the spatial arrangement of the first to fourth corresponding portions 21 to 24 is modified from the example of FIG. 1A so that the electrical connectional relationship is easy to understand. The configuration of the magnetic element illustrated in FIG. 6 may be combined with any of the configurations shown in FIGS. 7A to 7D.

As shown in FIG. 7A, the first corresponding portion 21 includes a first corresponding one-portion 21e and a first corresponding other-portion 21f. For example, the first corresponding one-portion 21e corresponds to the one end portion 11Ee of the first magnetic element 11E. For example, the first corresponding other-portion 21f corresponds to the other end portion 11Ef of the first magnetic element 11E. For example, the first corresponding one-portion 21e overlaps the one end portion 11Ee of the first magnetic element 11E in the first direction (the Y-axis direction). For example, the first corresponding other-portion 21f overlaps the other end portion 11Ef of the first magnetic element 11E in the first direction.

As shown in FIG. 7A, the second corresponding portion 22 includes a second corresponding one-portion 22e and a second corresponding other-portion 22f. For example, the second corresponding one-portion 22e corresponds to the one end portion 12Ee of the second magnetic element 12E. For example, the second corresponding other-portion 22f corresponds to the other end portion 12Ef of the second magnetic element 12E. For example, the second corresponding one-portion 22e overlaps the one end portion 12Ee of the second magnetic element 12E in the first direction (the Y-axis direction). For example, the second corresponding other-portion 22f overlaps the other end portion 12Ef of the second magnetic element 12E in the first direction.

As shown in FIG. 7A, the third corresponding portion 23 includes a third corresponding one-portion 23e and a third corresponding other-portion 23f. For example, the third corresponding one-portion 23e corresponds to the one end portion 13Ee of the third magnetic element 13E. For example, the third corresponding other-portion 23f corresponds to the other end portion 13Ef of the third magnetic element 13E. For example, the third corresponding one-portion 23e overlaps the one end portion 13Ee of the third magnetic element 13E in the first direction (the Y-axis direction). For example, the third corresponding other-portion 23f overlaps the other end portion 13Ef of the third magnetic element 13E in the first direction.

As shown in FIG. 7A, the fourth corresponding portion 24 includes a fourth corresponding one-portion 24e and a fourth corresponding other-portion 24f. For example, the fourth corresponding one-portion 24e corresponds to the one end portion 14Ee of the fourth magnetic element 14E. For example, the fourth corresponding other-portion 24f corresponds to the other end portion 14Ef of the fourth magnetic element 14E. For example, the fourth corresponding one-portion 24e overlaps the one end portion 14Ee of the fourth magnetic element 14E in the first direction (the Y-axis direction). For example, the fourth corresponding other-portion 24f overlaps the other end portion 14Ef of the fourth magnetic element 14E in the first direction.

In the example shown in FIG. 7A, the first corresponding one-portion 21e is electrically connected with the third corresponding one-portion 23e. The first corresponding other-portion 21f is electrically connected with the second corresponding one-portion 22e. The third corresponding other-portion 23f is electrically connected with the fourth corresponding one-portion 24e. The second corresponding other-portion 22f is electrically connected with the fourth corresponding other-portion 24f.

As shown in FIG. 7A, the magnetic sensor 110 may further include a first current circuit 71. The first current circuit 71 is configured to supply a first current I1 that includes an alternating current between a fifth connection point CP5 and a sixth connection point CP6, in which the fifth connection point CP5 is between the first corresponding other-portion 21f and the second corresponding one-portion 22e, and the sixth connection point CP6 is between the third corresponding other-portion 23f and the fourth corresponding one-portion 24e.

The magnetic field that is due to the first current I1 flowing through the first corresponding portion 21 is applied to the first magnetic element 11E. The magnetic field that is due to the first current I1 flowing through the second corresponding portion 22 is applied to the second magnetic element 12E. The magnetic field that is due to the first current I1 flowing through the third corresponding portion 23 is applied to the third magnetic element 13E. The magnetic field that is due to the first current I1 flowing through the fourth corresponding portion 24 is applied to the fourth magnetic element 14E.

For example, the element current Id may be a substantially direct current. The orientation of the element current Id is as shown in FIG. 6. The element current Id flows through the first magnetic element 11E in the orientation from the one end portion 11Ee of the first magnetic element 11E toward the other end portion 11Ef of the first magnetic element 11E. The element current Id flows through the second magnetic element 12E in the orientation from the one end portion 12Ee of the second magnetic element 12E toward the other end portion 12Ef of the second magnetic element 12E. The element current Id flows through the third magnetic element 13E in the orientation from the one end portion 13Ee of the third magnetic element 13E toward the other end portion 13Ef of the third magnetic element 13E. The element current Id flows through the fourth magnetic element 14E in the orientation from the one end portion 14Ee of the fourth magnetic element 14E toward the other end portion 14Ef of the fourth magnetic element 14E.

In the example shown in FIG. 7A, for example, the orientation of the first current I1 at one time (a first time) when the first current I1 that includes the alternating current component is supplied to the conductive member 20 is as follows. The first current I1 flows through the first corresponding portion 21 in the orientation from the first corresponding other-portion 21f toward the first corresponding one-portion 21e. The first current I1 flows through the second corresponding portion 22 in the orientation from the second corresponding one-portion 22e toward the second corresponding other-portion 22f. The first current I1 flows through the third corresponding portion 23 in the orientation from the third corresponding one-portion 23e toward the third corresponding other-portion 23f. The first current I1 flows through the fourth corresponding portion 24 in the orientation from the fourth corresponding other-portion 24f toward the fourth corresponding one-portion 24e.

For example, the relationship between the orientation of the first current I1 flowing through the second corresponding portion 22 at the first time and the orientation of the element current Id flowing through the second magnetic element 12E is opposite to (the opposite phase of) the relationship between the orientation of the first current I1 flowing through the first corresponding portion 21 at the first time and the orientation of the element current Id flowing through the first magnetic element 11E. The relationship between the orientation of the first current I1 flowing through the fourth corresponding portion 24 at the first time and the orientation of the element current Id flowing through the fourth magnetic element 14E is opposite to (the opposite phase of) the relationship between the orientation of the first current I1 flowing through the third corresponding portion 23 at the first time and the orientation of the element current Id flowing through the third magnetic element 13E.

At the first time in the example shown in FIG. 7A, the first current I1 has the orientation from the first corresponding other-portion 21f toward the first corresponding one-portion 21e, the orientation from the second corresponding one-portion 22e toward the second corresponding other-portion 22f, the orientation from the third corresponding one-portion 23e toward the third corresponding other-portion 23f, and the orientation from the fourth corresponding other-portion 24f toward the fourth corresponding one-portion 24e.

In the example shown in FIG. 7A, a first circuit that includes the first and third corresponding portions 21 and 23 that are connected in series is provided. A second circuit that includes the second and fourth corresponding portions 22 and 24 that are connected in series is provided. The first circuit and the second circuit are electrically connected in parallel.

The noise can be further suppressed by such a combination of the first to fourth magnetic elements 11E to 14E and the first to fourth corresponding portions 21 to 24. Examples of the signals obtained from the first to fourth magnetic elements 11E to 14E are described below.

In a magnetic sensor 110a as shown in FIG. 7B, the first corresponding one-portion 21e is electrically connected with the second corresponding other-portion 22f. The first corresponding other-portion 21f is electrically connected with the fourth corresponding one-portion 24e. The third corresponding one-portion 23e is electrically connected with the fourth corresponding other-portion 24f. The third corresponding other-portion 23f is electrically connected with the second corresponding one-portion 22e.

In the magnetic sensor 110a, the first current circuit 71 is configured to supply the first current I1 that includes the alternating current between a seventh connection point CP7 and an eighth connection point CP8, in which the seventh connection point CP7 is between the first corresponding one-portion 21e and the second corresponding other-portion 22f, and the eighth connection point CP8 is between the third corresponding one-portion 23e and the fourth corresponding other-portion 24f.

At one time (the first time) in the magnetic sensor 110a, the first current I1 has the orientation from the first corresponding other-portion 21f toward the first corresponding one-portion 21e, the orientation from the second corresponding one-portion 22e toward the second corresponding other-portion 22f, the orientation from the third corresponding one-portion 23e toward the third corresponding other-portion 23f, and the orientation from the fourth corresponding other-portion 24f toward the fourth corresponding one-portion 24e. A configuration such as that shown in FIG. 7B may be combined with the configuration of FIG. 6.

In the example shown in FIG. 7B, the first circuit that includes the first and fourth corresponding portions 21 and 24 that are connected in series is provided. The second circuit that includes the second and third corresponding portions 22 and 23 that are connected in series is provided. The first circuit and the second circuit are electrically connected in parallel.

In a magnetic sensor 110b as shown in FIG. 7C, the first corresponding other-portion 21f is electrically connected with the fourth corresponding one-portion 24e. The third corresponding other-portion 23f is electrically connected with the second corresponding one-portion 22e. The second corresponding other-portion 22f is electrically connected with the fourth corresponding other-portion 24f.

In the magnetic sensor 110b, the first current circuit 71 is configured to supply the first current I1 that includes the alternating current between the first corresponding one-portion 21e and the third corresponding one-portion 23e.

At one time (the first time) in the magnetic sensor 110b, the first current I1 has the orientation from the first corresponding other-portion 21f toward the first corresponding one-portion 21e, the orientation from the second corresponding one-portion 22e toward the second corresponding other-portion 22f, the orientation from the third corresponding one-portion 23e toward the third corresponding other-portion 23f, and the orientation from the fourth corresponding other-portion 24f toward the fourth corresponding one-portion 24e. A configuration such as that shown in FIG. 7C may be combined with the configuration of FIG. 6.

In the example shown in FIG. 7C, the first to fourth corresponding portions 21 to 24 are electrically connected in series to each other.

In a magnetic sensor 110c as shown in FIG. 7D, the first corresponding one-portion 21e is electrically connected with the second corresponding other-portion 22f, the third corresponding other-portion 23f, and the fourth corresponding one-portion 24e. The first corresponding other-portion 21f is electrically connected with the second corresponding one-portion 22e, the third corresponding one-portion 23e, and the fourth corresponding other-portion 24f.

In the magnetic sensor 110c, the first current circuit 71 is configured to supply the first current I1 that includes the alternating current between a ninth connection point CP9 and a tenth connection point CP10, in which the ninth connection point CP9 is between the first corresponding one-portion 21e, the second corresponding other-portion 22f, the third corresponding other-portion 23f, and the fourth corresponding one-portion 24e, and the tenth connection point CP10 is between the first corresponding other-portion 21f, the second corresponding one-portion 22e, the third corresponding one-portion 23e, and the fourth corresponding other-portion 24f.

At one time (the first time) in the magnetic sensor 110c, the first current I1 has the orientation from the first corresponding other-portion 21f toward the first corresponding one-portion 21e, the orientation from the second corresponding one-portion 22e toward the second corresponding other-portion 22f, the orientation from the third corresponding one-portion 23e toward the third corresponding other-portion 23f, and the orientation from the fourth corresponding other-portion 24f toward the fourth corresponding one-portion 24e. A configuration such as that shown in FIG. 7D may be combined with the configuration of FIG. 6.

In the example shown in FIG. 7D, the first to fourth corresponding portions 21 to 24 are electrically connected in parallel to each other.

The element current circuit 75, the detection circuit 73, and the first current circuit 71 may be included in a control circuit part 70.

In the example shown in FIG. 6, the magnetic element that is electrically connected in series with the first magnetic element 11E is the second magnetic element 12E. The magnetic element that is electrically connected in series with the third magnetic element 13E is the fourth magnetic element 14E. The set that includes the first and second magnetic elements 11E and 12E is electrically connected in parallel with the set that includes the third and fourth magnetic elements 13E and 14E. Various modifications of the spatial arrangement of the first to fourth magnetic elements 11E to 14E are possible.

For example, the electrical resistances of the first to fourth magnetic elements 11E to 14E have substantially even-function characteristics with respect to the external magnetic field. For example, the electrical resistances have substantially even-function characteristics with respect to the currents that flow through the conductive member 20 (the first to fourth corresponding portions 21 to 24). By applying an alternating magnetic field based on the first current I1 that includes the alternating current to the magnetic element that has an even-function characteristic, detection with higher sensitivity is possible as described below.

An example of the change of the electrical resistance of a magnetic element (the first magnetic element 11E) when a current flows in the conductive member 20 will now be described. The electrical resistance of the first magnetic element 11E will now be described. The following description is applicable to the second to fourth magnetic elements 12E to 14E.

Figure 8A:
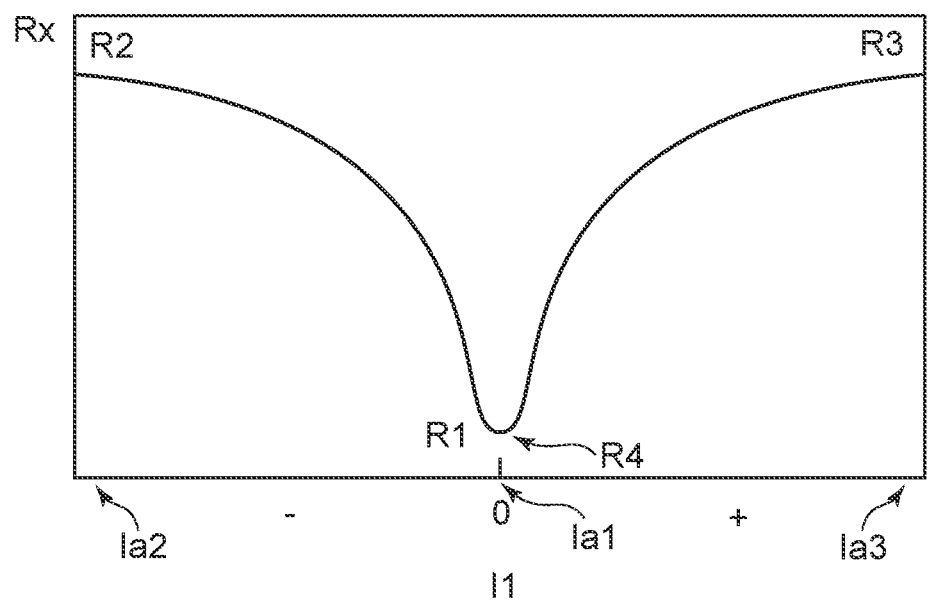
FIGS. 8A and 8B are schematic views illustrating characteristics of the magnetic sensor according to the first embodiment.
Figure 8B:
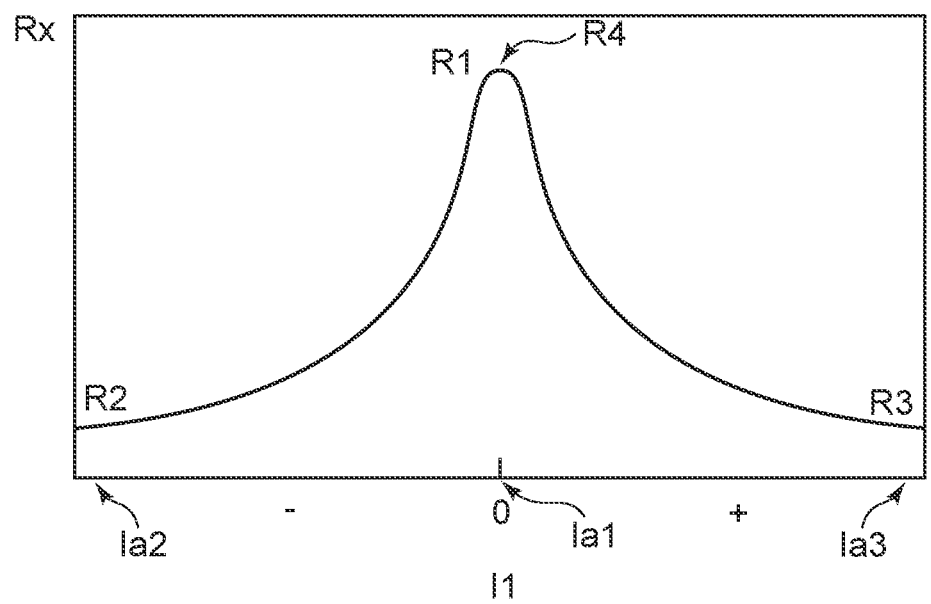

FIGS. 8A and 8B are schematic views illustrating characteristics of the magnetic sensor according to the first embodiment.

In these figures, the horizontal axis corresponds to the value of the current (e.g., the first current I1) flowing in the conductive member 20 (e.g., the first corresponding portion 21). The vertical axis is an electrical resistance Rx of the first magnetic element 11E. According to the embodiment as shown in FIGS. 8A and 8B, the electrical resistance Rx has an even-function characteristic with respect to the change of the current (the first current I1).

For example, the electrical resistance Rx of the first magnetic element 11E has a first value R1 when a first-value current Ia1 is supplied to the first corresponding portion 21. The electrical resistance Rx has a second value R2 when a second-value current Ia2 is supplied to the first corresponding portion 21. The electrical resistance Rx has a third value R3 when a third-value current Ia3 is supplied to the first corresponding portion 21. The absolute value of the first-value current Ia1 is less than the absolute value of the second-value current Ia2 and less than the absolute value of the third-value current Ia3. For example, the first-value current Ia1 may be substantially 0. The orientation of the second-value current Ia2 is opposite to the orientation of the third-value current Ia3.

In the example of FIG. 8A, the first value R1 is less than the second value R2 and less than the third value R3. The first value R1 is, for example, the minimum value of the electrical resistance. In the example of FIG. 8B, the first value R1 is greater than the second value R2 and greater than the third value R3. The first value R1 is, for example, the maximum value of the electrical resistance.

For example, the electrical resistance Rx has a fourth value R4 when a current does not flow in the conductive member 20 (the first corresponding portion 21). For example, the first value R1 is substantially equal to the fourth value R4 when the current does not flow. For example, the ratio of the absolute value of the difference between the first value R1 and the fourth value R4 to the fourth value R4 is not more than 0.01. The ratio may be not more than 0.001. A substantially even-function characteristic is obtained for the positive and negative currents.

Such a relationship between the first current I1 and the electrical resistance Rx is based on the magnetic field due to the first current I1 being applied to the first magnetic element 11E and based on the electrical resistance Rx of the first magnetic element 11E changing according to the intensity of the magnetic field.

Similarly to the example in FIG. 8A or FIG. 8B, the electrical resistance Rx when an external magnetic field is applied to the first magnetic element 11E also has an even-function characteristic. The external magnetic field includes, for example, a component along the Z-axis direction.

Figure 9A:
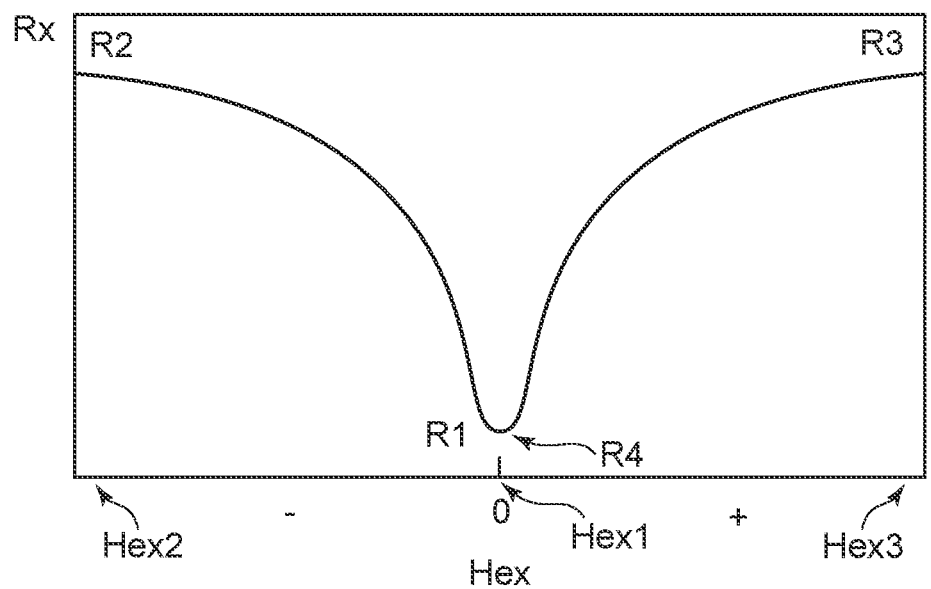
FIGS. 9A and 9B are schematic views illustrating characteristics of the magnetic sensor according to the first embodiment.
Figure 9B:
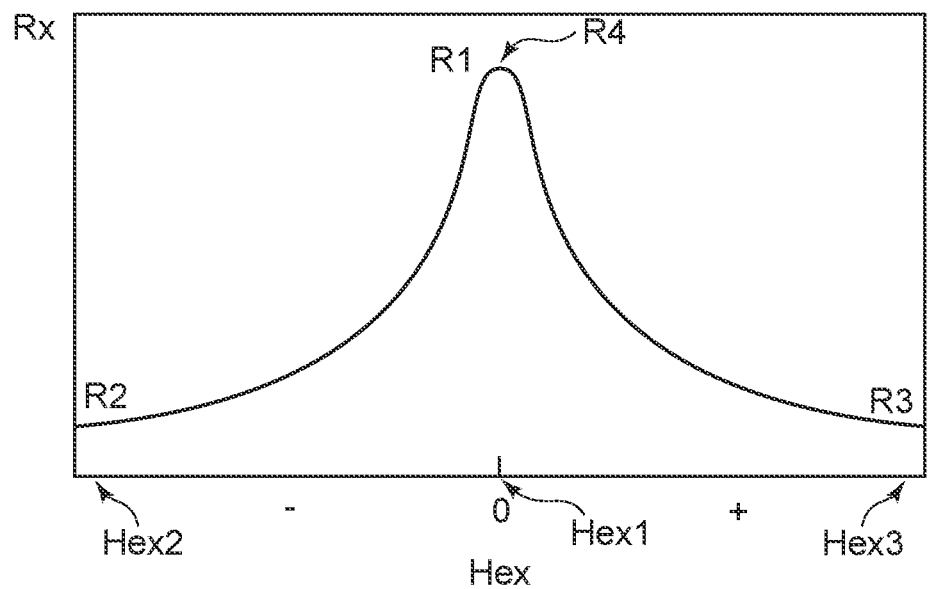

FIGS. 9A and 9B are schematic views illustrating characteristics of the magnetic sensor according to the first embodiment.

In these figures, the horizontal axis is the intensity of an external magnetic field Hex that is applied to the first magnetic element 11E. The vertical axis is the electrical resistance Rx of the first magnetic element 11E. These figures correspond to the R-H characteristic.

As shown in FIGS. 9A and 9B, the electrical resistance Rx has an even-function characteristic with respect to the magnetic field (the external magnetic field Hex, e.g., a magnetic field in the Z-axis direction) that is applied to the first magnetic element 11E.

As shown in FIGS. 9A and 9B, the electrical resistance Rx of the first magnetic element 11E has the first value R1 when a first magnetic field Hex1 is applied to the first magnetic element 11E. The electrical resistance Rx has the second value R2 when a second magnetic field Hex2 is applied to the first magnetic element 11E. The electrical resistance Rx has the third value R3 when a third magnetic field Hex3 is applied to the first magnetic element 11E. The absolute value of the first magnetic field Hex1 is less than the absolute value of the second magnetic field Hex2 and less than the absolute value of the third magnetic field Hex3. The orientation of the second magnetic field Hex2 is opposite to the orientation of the third magnetic field Hex3.

In the example of FIG. 9A, the first value R1 is less than the second value R2 and less than the third value R3. In the example of FIG. 9B, the first value R1 is greater than the second value R2 and greater than the third value R3. For example, the electrical resistance Rx has the fourth value R4 when the external magnetic field is not applied to the first magnetic element 11E. The first value R1 is substantially equal to the fourth value R4 when the external magnetic field is not applied. For example, the ratio of the absolute value of the difference between the first value R1 and the fourth value R4 to the fourth value R4 is not more than 0.01. The ratio may be not more than 0.001. A substantially even-function characteristic is obtained for the positive and negative external magnetic fields.

By utilizing such an even-function characteristic, highly-sensitive detection is possible as follows.

An example will now be described in which the first current I1 is an alternating current and substantially does not include a direct current component. The first current I1 (the alternating current) is supplied to the conductive member 20 (the first corresponding portion 21); and an alternating magnetic field due to the alternating current is applied to the first magnetic element 11E. An example of the change of the electrical resistance Rx at this time will be described.

Figure 10A:
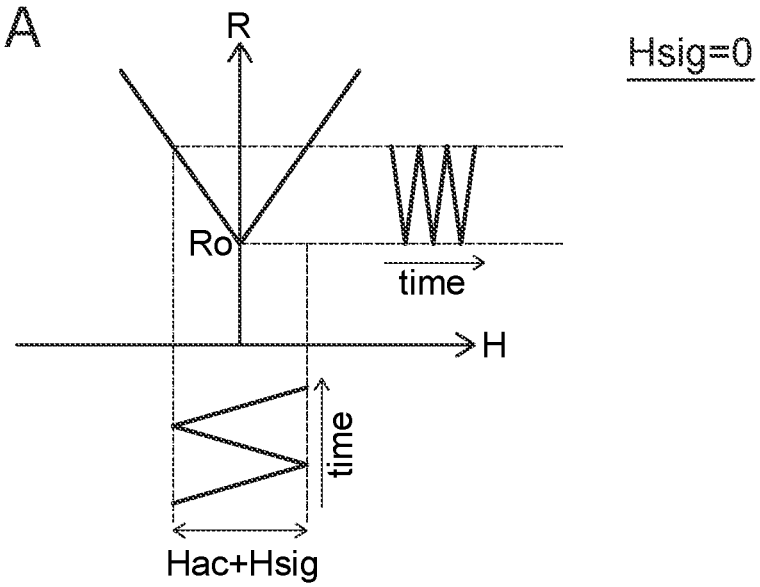
FIGS. 10A to 10C are graphs illustrating characteristics of the magnetic sensor according to the first embodiment.
Figure 10B:
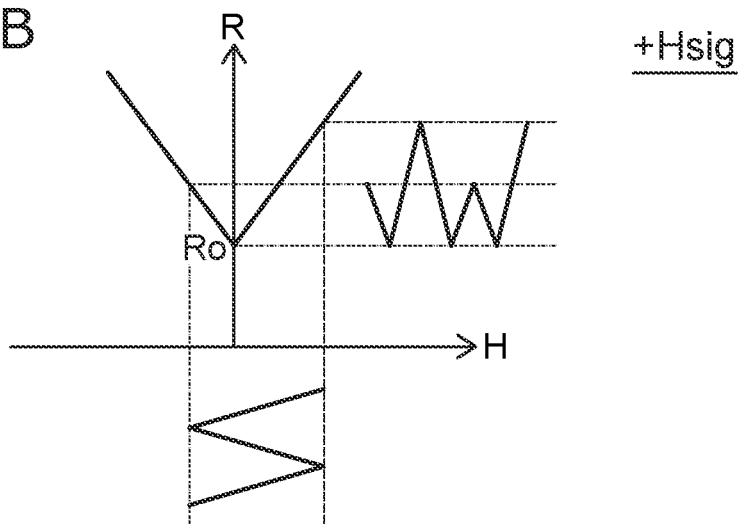
Figure 10C:
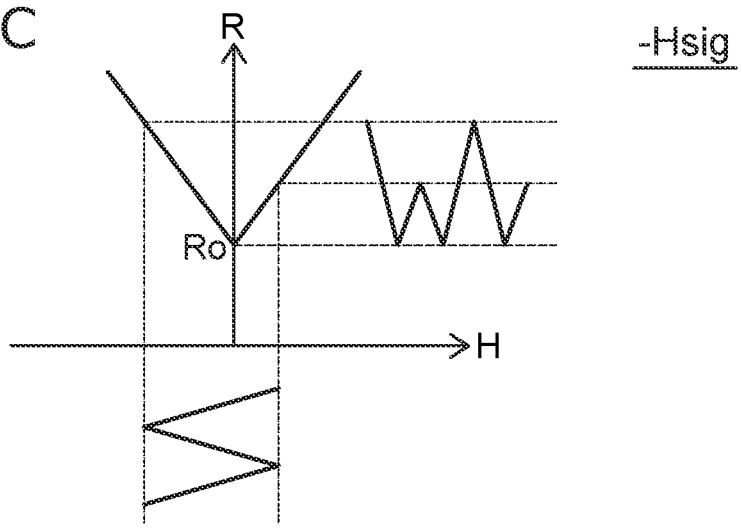

FIGS. 10A to 10C are graphs illustrating characteristics of the magnetic sensor according to the first embodiment.

FIG. 10A shows characteristics when a signal magnetic field Hsig (an external magnetic field) applied to the first magnetic element 11E is 0. FIG. 10B shows characteristics when the signal magnetic field Hsig is positive. FIG. 10C shows characteristics when the signal magnetic field Hsig is negative. These figures show the relationship between a magnetic field H and a resistance R (corresponding to the electrical resistance Rx).

As shown in FIG. 10A, when the signal magnetic field Hsig is 0, the resistance R has a characteristic that is symmetric with respect to the positive and negative magnetic field H. When an alternating magnetic field Hac is zero, the resistance R is a low resistance Ro. For example, the magnetization of the free magnetic layer is rotated substantially identically to the positive and negative magnetic field H. Therefore, a symmetric resistance change is obtained. The change of the resistance R with respect to the alternating magnetic field Hac has the same value between the positive and negative polarities. The period of the change of the resistance R is ½ times the period of the alternating magnetic field Hac. The change of the resistance R substantially does not include the frequency component of the alternating magnetic field Hac.

As shown in FIG. 10B, the characteristic of the resistance R shifts to the positive magnetic field H side when a positive signal magnetic field Hsig is applied. For example, the resistance R becomes high for the alternating magnetic field Hac on the positive side. The resistance R becomes low for the alternating magnetic field Hac on the negative side.

As shown in FIG. 10C, the characteristic of the resistance R shifts to the negative magnetic field H side when a negative signal magnetic field Hsig is applied. For example, the resistance R becomes low for the alternating magnetic field Hac on the positive side. The resistance R becomes high for the alternating magnetic field Hac on the negative side.

Change in the resistance R is different for the positive and negative of the alternating magnetic field Hac when a signal magnetic field Hsig with non-zero magnitude is applied. The period of the change of the resistance R with respect to the positive and negative of the alternating magnetic field Hac is equal to the period of the alternating magnetic field Hac. An output voltage that has an alternating current frequency component corresponding to the signal magnetic field Hsig is generated.

The characteristics described above are obtained in the case where the signal magnetic field Hsig does not temporally change. The case where the signal magnetic field Hsig temporally changes is as follows. The frequency of the signal magnetic field Hsig is taken as a signal frequency fsig. The frequency of the alternating magnetic field Hac is taken as an alternating current frequency fac. In such a case, an output that corresponds to the signal magnetic field Hsig is generated at the frequency of fac±fsig.

In the case where the signal magnetic field Hsig temporally changes, the signal frequency fsig is, for example, not more than 1 kHz. On the other hand, the alternating current frequency fac is sufficiently greater than the signal frequency fsig. For example, the alternating current frequency fac is not less than 10 times the signal frequency fsig.

For example, the signal magnetic field Hsig can be detected with high accuracy by extracting an output voltage having the same period (frequency) component (alternating current frequency component) as the period (the frequency) of the alternating magnetic field Hac. In the magnetic sensor 112 according to the embodiment, the external magnetic field Hex (the signal magnetic field Hsig) that is the detection object can be detected with high sensitivity by utilizing such characteristics. According to the embodiment, the external magnetic field Hex (the signal magnetic field Hsig) and the alternating magnetic field Hac due to the first current I1 can be efficiently applied to the first magnetic element 11E by the magnetic member 51. High sensitivity is obtained.

Figure 11A:
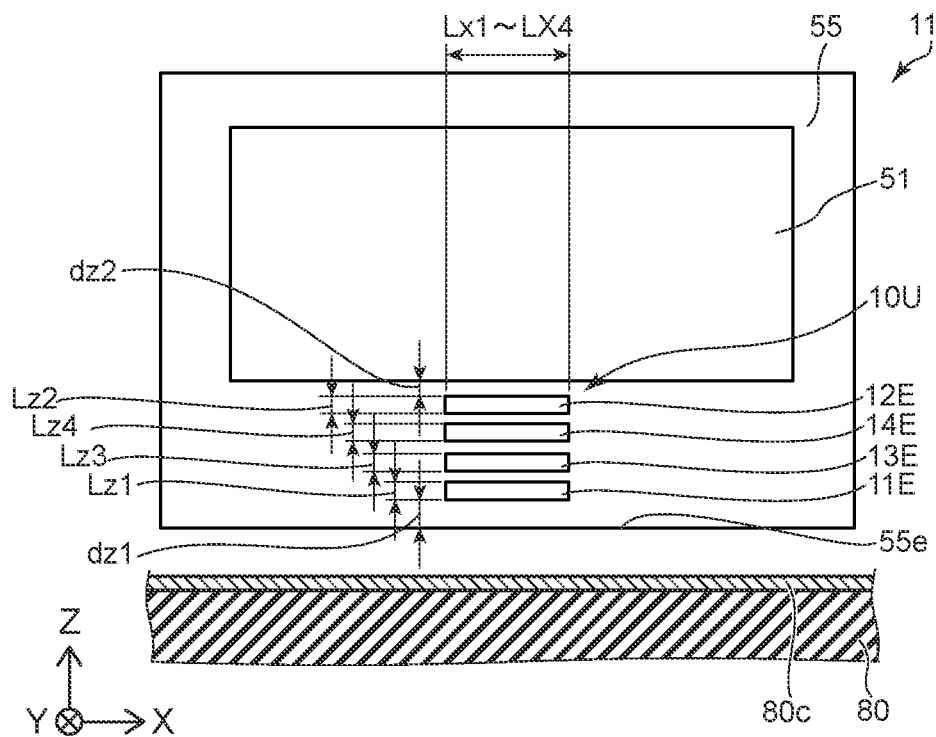
FIGS. 11A and 11B are schematic views illustrating a magnetic sensor according to the first embodiment.
Figure 11B:
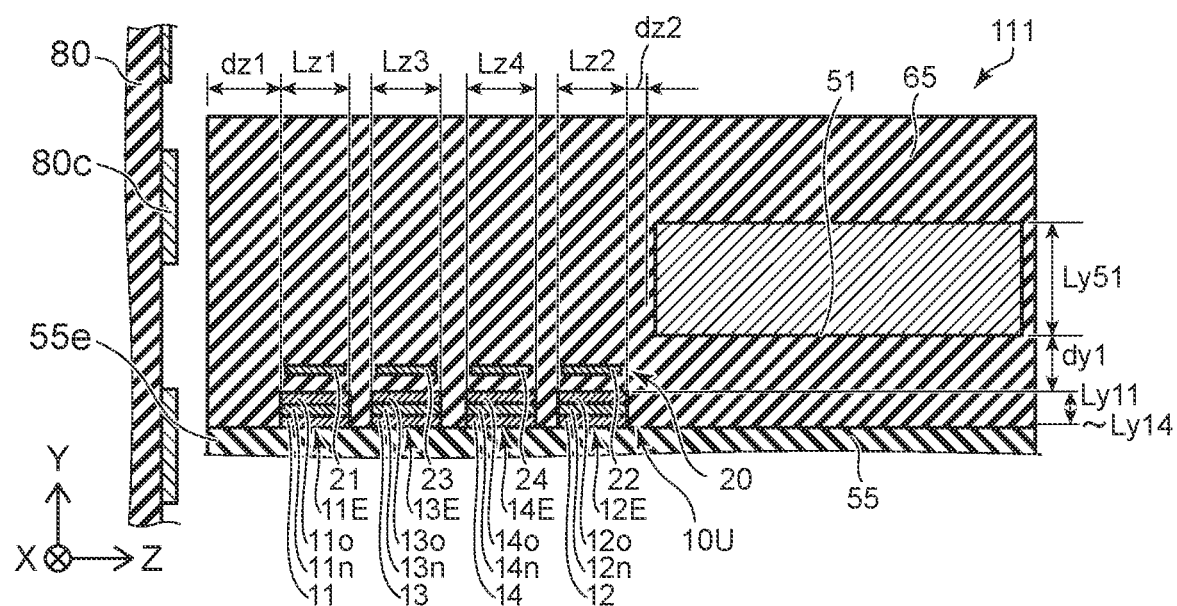

FIGS. 11A and 11B are schematic views illustrating a magnetic sensor according to the first embodiment.

FIG. 11A is a plan view. FIG. 11B is a cross-sectional view.

As shown in FIGS. 11A and 11B, the magnetic sensor 111 according to the embodiment includes the base body 55, the magnetic member 51, and the element part 10U. In the magnetic sensor 111 as well, the element part 10U includes multiple magnetic elements (the first to fourth magnetic elements 11E to 14E, etc.). In the magnetic sensor 111, at least one of the multiple magnetic elements (e.g., the first magnetic element 11E) does not overlap the magnetic member 51 in the Z-axis direction. Otherwise, the configuration of the magnetic sensor 111 may be similar to the configuration of the magnetic sensor 110. In the magnetic sensor 111 as well, high sensitivity is obtained.

Figure 12A:
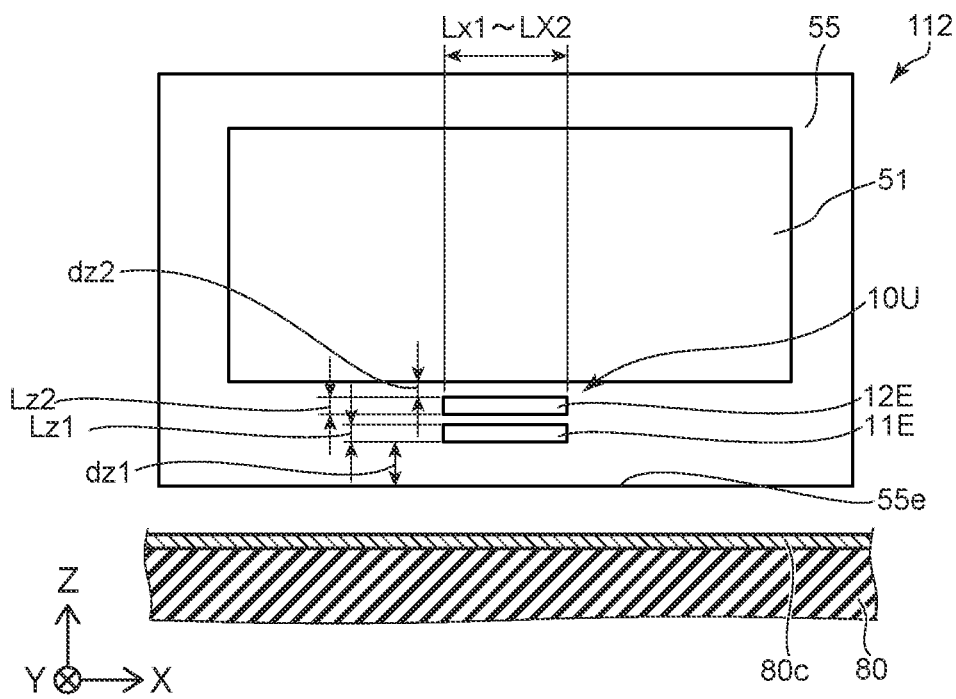
FIGS. 12A and 12B are schematic views illustrating a magnetic sensor according to the first embodiment.
Figure 12B:
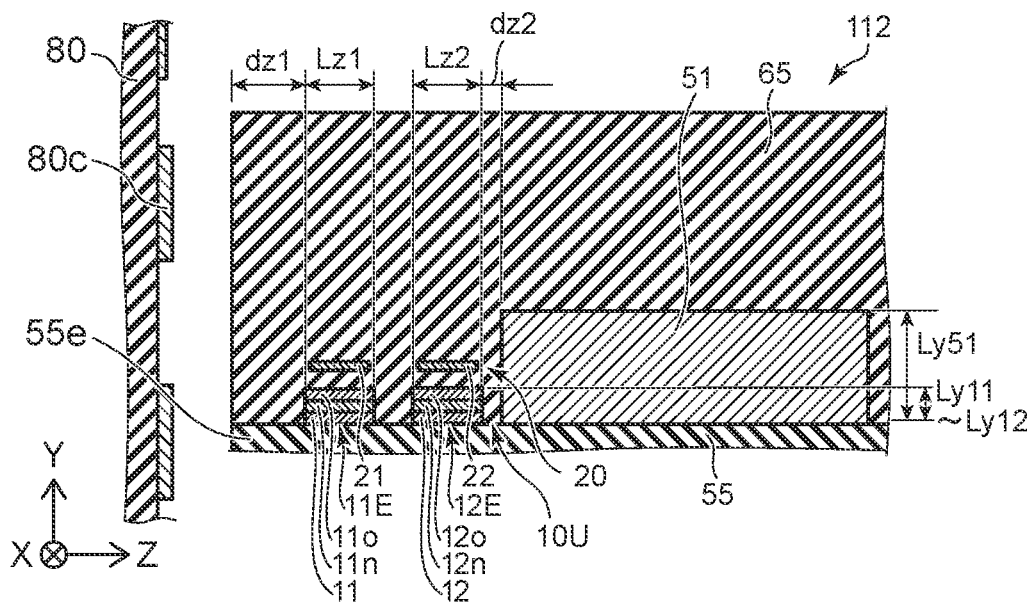

FIGS. 12A and 12B are schematic views illustrating a magnetic sensor according to the first embodiment.

FIG. 12A is a plan view. FIG. 12B is a cross-sectional view.

As shown in FIGS. 12A and 12B, the magnetic sensor 112 according to the embodiment includes the base body 55, the magnetic member 51, and the element part 10U. In the magnetic sensor 112, the element part 10U includes two magnetic elements (the first magnetic element 11E and the second magnetic element 12E). Otherwise, the configuration of the magnetic sensor 112 may be similar to the configuration of the magnetic sensor 110. In the magnetic sensor 112 as well, high sensitivity is obtained.

Figures 13A, 13B:
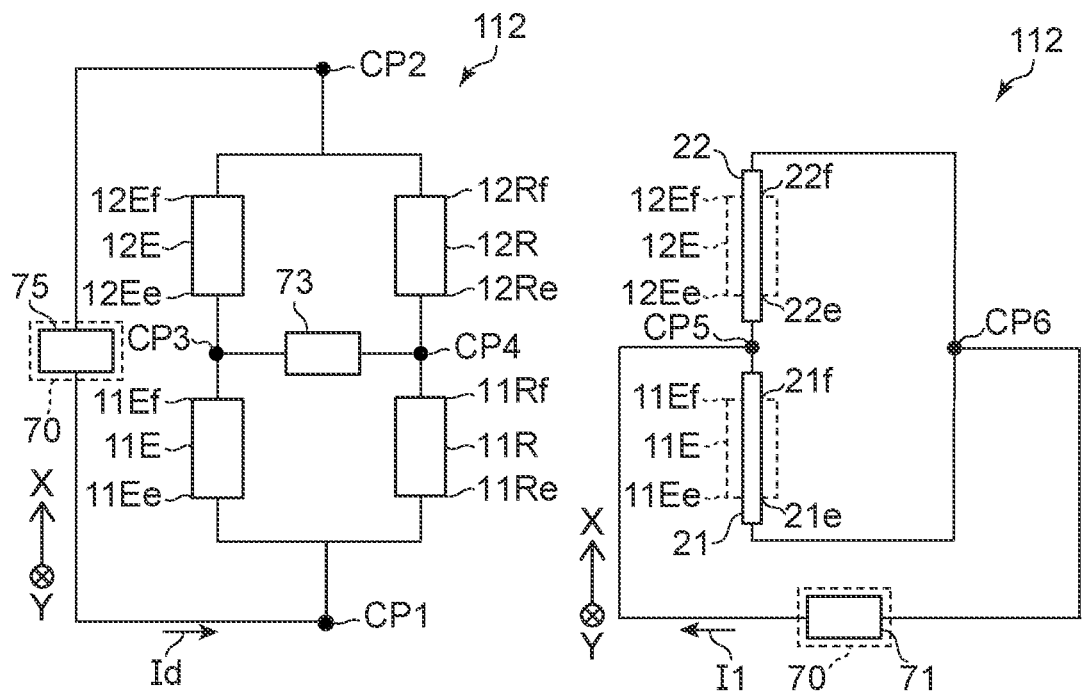
FIGS. 13A and 13B are schematic views illustrating the magnetic sensor according to the first embodiment.

FIGS. 13A and 13B are schematic views illustrating the magnetic sensor according to the first embodiment.

In the magnetic sensor 112 according to the embodiment as shown in FIG. 13A, the element part 10U includes the first magnetic element 11E, the second magnetic element 12E, a first resistance element 11R, and a second resistance element 12R. Otherwise, the configuration of the magnetic sensor 112 may be, for example, the same as that of the magnetic sensor 110.

In the magnetic sensor 112 as shown in FIG. 13A, the one end portion 11Ee of the first magnetic element 11E is electrically connected with one end portion 11Re of the first resistance element 11R. The other end portion 11Ef of the first magnetic element 11E is electrically connected with the one end portion 12Ee of the second magnetic element 12E. Another end portion 11Rf of the first resistance element 11R is electrically connected with one end portion 12Re of the second resistance element 12R. The other end portion 12Ef of the second magnetic element 12E is electrically connected with another end portion 12Rf of the second resistance element 12R.

As shown in FIG. 13B, the element current circuit 75 is configured to supply the element current Id between the first connection point CP1 and the second connection point CP2, in which the first connection point CP1 is between the one end portion 11Ee of the first magnetic element 11E and the one end portion 11Re of the first resistance element 11R, and the second connection point CP2 is between the other end portion 12Ef of the second magnetic element 12E and the other end portion 12Rf of the second resistance element 12R.

The detection circuit 73 is configured to detect the change of the potential between the third connection point CP3 and the fourth connection point CP4, in which the third connection point CP3 is between the other end portion 11Ef of the first magnetic element 11E and the one end portion 12Ee of the second magnetic element 12E, and the fourth connection point CP4 is between the other end portion 11Rf of the first resistance element 11R and the one end portion 12Re of the second resistance element 12R.

As shown in FIG. 13B, the first corresponding other-portion 21f is electrically connected with the second corresponding one-portion 22e. The first corresponding one-portion 21e is electrically connected with the second corresponding other-portion 22f. The first current circuit 71 is configured to supply the first current I1 that includes the alternating current between the fifth connection point CP5 and the sixth connection point CP6, in which the fifth connection point CP5 is between the first corresponding other-portion 21f and the second corresponding one-portion 22e, and the sixth connection point CP6 is between the first corresponding one-portion 21e and the second corresponding other-portion 22f.

Second Embodiment

A second embodiment relates to an inspection device. As described below, the inspection device may include a diagnostic device.

Figure 14:
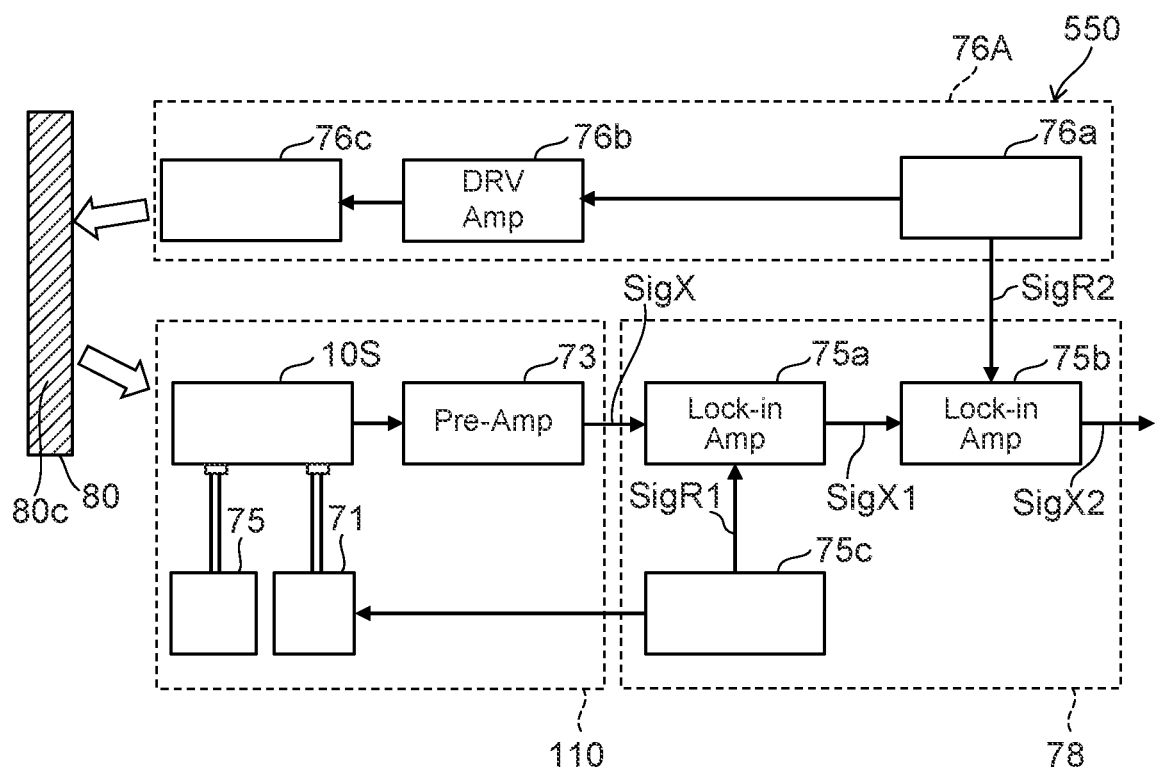
FIG. 14 is a schematic view illustrating an inspection device according to a second embodiment.

FIG. 14 is a schematic view illustrating the inspection device according to the second embodiment.

As shown in FIG. 14, the inspection device 550 according to the embodiment includes a processor 78 and the magnetic sensor (in the example of FIG. 14, the magnetic sensor 110) according to the embodiment. The processor 78 processes an output signal SigX obtained from the magnetic sensor 110. In the example, the processor 78 includes a sensor control circuit part 75c, a first lock-in amplifier 75a, and a second lock-in amplifier 75b. For example, the first current circuit 71 is controlled by the sensor control circuit part 75c; and the first current I1 that includes the alternating current component is supplied from the first current circuit 71 to a sensor part 10S. The frequency of the alternating current component of the first current I1 is, for example, not more than 100 kHz. The element current Id is supplied from the element current circuit 75 to the sensor part 10S. The sensor part 10S includes, for example, the element part 10U. The change of the potential of the sensor part 10S is detected by the detection circuit 73. For example, the output of the detection circuit 73 is the output signal SigX.

In the example, the inspection device 550 includes a magnetic field application part 76A. The magnetic field application part 76A is configured to apply a magnetic field to the detection object 80. The detection object 80 is, for example, the inspection object. The detection object 80 includes at least the inspection conductive member 80c such as a metal, etc. For example, an eddy current is generated in the inspection conductive member 80c when the magnetic field due to the magnetic field application part 76A is applied to the inspection conductive member 80c. The state of the eddy current changes when there is a flaw or the like in the inspection conductive member 80c. The state (e.g., the flaw, etc.) of the inspection conductive member 80c can be inspected by the magnetic sensor (e.g., the magnetic sensor 110, etc.) detecting the magnetic field due to the eddy current. The magnetic field application part 76A is, for example, an eddy current generator.

In the example, the magnetic field application part 76A includes an application control circuit part 76a, a drive amplifier 76b, and a coil 76c. A current is supplied to the drive amplifier 76b by the control by the application control circuit part 76a. The current is, for example, an alternating current. The frequency of the current is, for example, an eddy current excitation frequency. The eddy current excitation frequency is, for example, not less than 10 Hz and not more than 100 kHz. The eddy current excitation frequency may be, for example, less than 100 kHz.

For example, information (which may be, for example, a signal) that relates to the frequency of the alternating current component of the first current I1 is supplied from the sensor control circuit part 75c to the first lock-in amplifier 75a as a reference signal. The output of the first lock-in amplifier 75a is supplied to the second lock-in amplifier 75b. Information (which may be, for example, a signal) that relates to the eddy current excitation frequency is supplied from the application control circuit part 76a to the second lock-in amplifier 75b as a reference signal. The second lock-in amplifier 75b is configured to output a signal component corresponding to the eddy current excitation frequency.

Thus, for example, the processor 78 includes the first lock-in amplifier 75a. The output signal SigX that is obtained from the magnetic sensor 110 and a signal SigR1 that corresponds to the frequency of the alternating current component included in the first current I1 are input to the first lock-in amplifier 75a. The first lock-in amplifier 75a is configured to output an output signal SigX1 that uses the signal SigR1 corresponding to the frequency of the alternating current component included in the first current I1 as a reference signal. By providing the first lock-in amplifier 75a, it is possible to suppress noise and detect with high sensitivity.

The processor 78 may further include the second lock-in amplifier 75b. The output signal SigX1 of the first lock-in amplifier 75a and a signal SigR2 that corresponds to the frequency (the eddy current excitation frequency) of the supply signal (in the example, the magnetic field due to the magnetic field application part 76A) supplied toward the detection object 80 (the inspection object) are input to the second lock-in amplifier 75b. The second lock-in amplifier 75b is configured to output an output signal SigX2 that uses the signal SigR2 corresponding to the frequency of the supply signal supplied toward the detection object 80 (the inspection object) as a reference signal). By providing the second lock-in amplifier 75b, it is possible to further suppress noise and detect with even higher sensitivity.

A defect such as a flaw or the like of the inspection conductive member 80c of the detection object 80 can be inspected by the inspection device 550.

Figure 15:
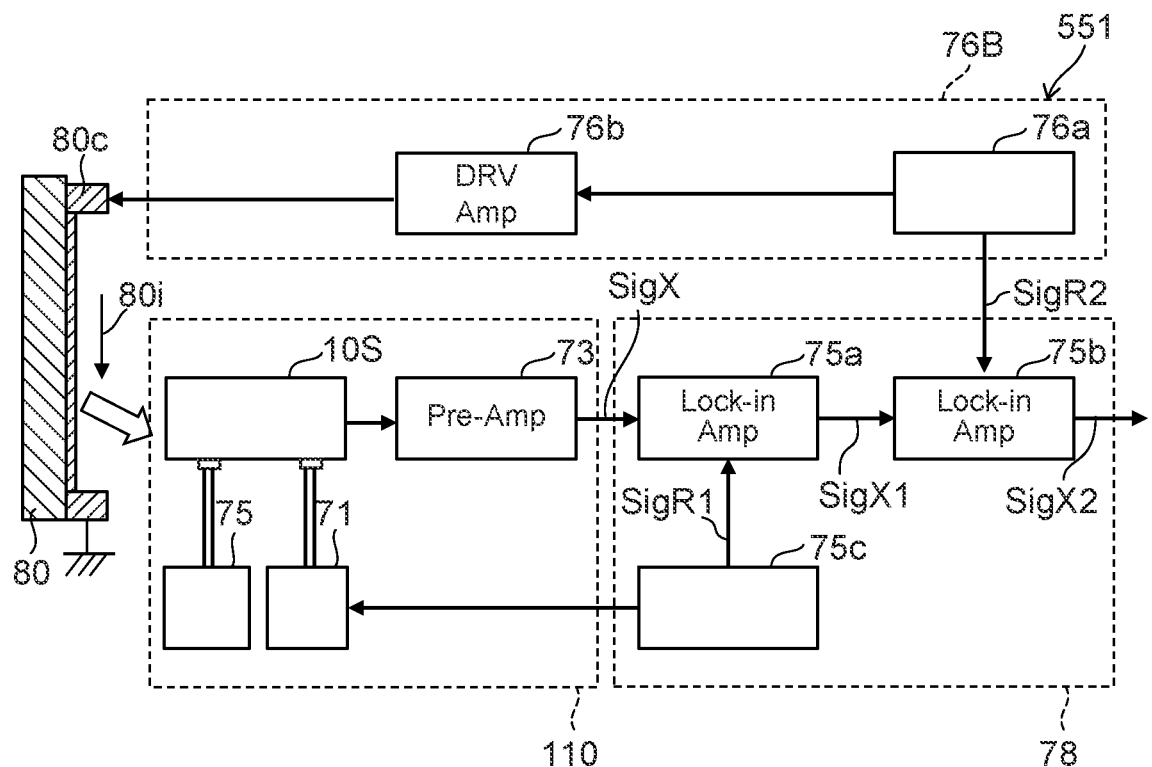
FIG. 15 is a schematic view illustrating an inspection device according to the second embodiment.

FIG. 15 is a schematic view illustrating an inspection device according to the second embodiment.

As shown in FIG. 15, the inspection device 551 according to the embodiment includes the processor 78 and the magnetic sensor (e.g., the magnetic sensor 110) according to the embodiment. The configurations of the magnetic sensor and the processor 78 of the inspection device 551 may be similar to those of the inspection device 550. In the example, the inspection device 551 includes a detection object driver 76B. The detection object driver 76B is configured to supply a current to the inspection conductive member 80c included in the detection object 80. The inspection conductive member 80c is, for example, wiring included in the detection object 80. A magnetic field that is due to a current 80i flowing in the inspection conductive member 80c is detected by the magnetic sensor 110. The inspection conductive member 80c can be inspected based on an abnormality due to the detection result of the magnetic sensor 110. The detection object 80 may be, for example, an electronic device such as a semiconductor device, etc. The detection object 80 may be, for example, a battery, etc.

In the example, the detection object driver 76B includes the application control circuit part 76a and the drive amplifier 76b. The drive amplifier 76b is controlled by the application control circuit part 76a; and a current is supplied from the drive amplifier 76b to the inspection conductive member 80c. The current is, for example, an alternating current. For example, the alternating current is supplied to the inspection conductive member 80c. The frequency of the alternating current is, for example, not less than 10 Hz and not more than 100 kHz. The frequency may be, for example, less than 100 kHz. In the example as well, for example, by providing the first lock-in amplifier 75a and the second lock-in amplifier 75b, it is possible to suppress noise and detect with high sensitivity. In one example of the inspection device 551, multiple magnetic sensors (e.g., the multiple magnetic sensors 110) may be provided. The multiple magnetic sensors are, for example, a sensor array. The inspection conductive member 80c can be inspected in a short period of time by the sensor array. In one example of the inspection device 551, the inspection conductive member 80c may be inspected by scanning the magnetic sensor (e.g., the magnetic sensor 110).

Figure 16:
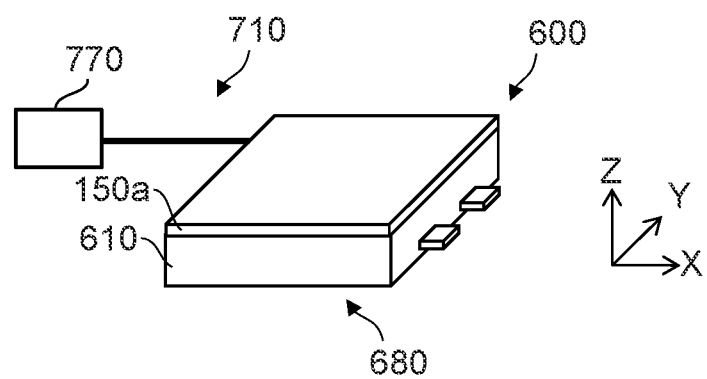
FIG. 16 is a schematic perspective view showing an inspection device according to the second embodiment.

FIG. 16 is a schematic perspective view showing an inspection device according to the second embodiment.

As shown in FIG. 16, the inspection device 710 according to the embodiment includes a magnetic sensor 150a and a processor 770. The magnetic sensor 150a may be any magnetic sensor according to the first embodiment or a modification of the magnetic sensor. The processor 770 processes an output signal obtained from the magnetic sensor 150a. The processor 770 may perform a comparison between a reference value and the signal obtained from the magnetic sensor 150a, etc. The processor 770 is configured to output an inspection result based on the processing result.

For example, an inspection object 680 is inspected by the inspection device 710. The inspection object 680 is, for example, an electronic device (including a semiconductor circuit, etc.). The inspection object 680 may be, for example, a battery 610, etc.

For example, the magnetic sensor 150a according to the embodiment may be used together with the battery 610. For example, a battery system 600 includes the battery 610 and the magnetic sensor 150a. The magnetic sensor 150a can detect a magnetic field generated by a current flowing in the battery 610.

Figure 17:
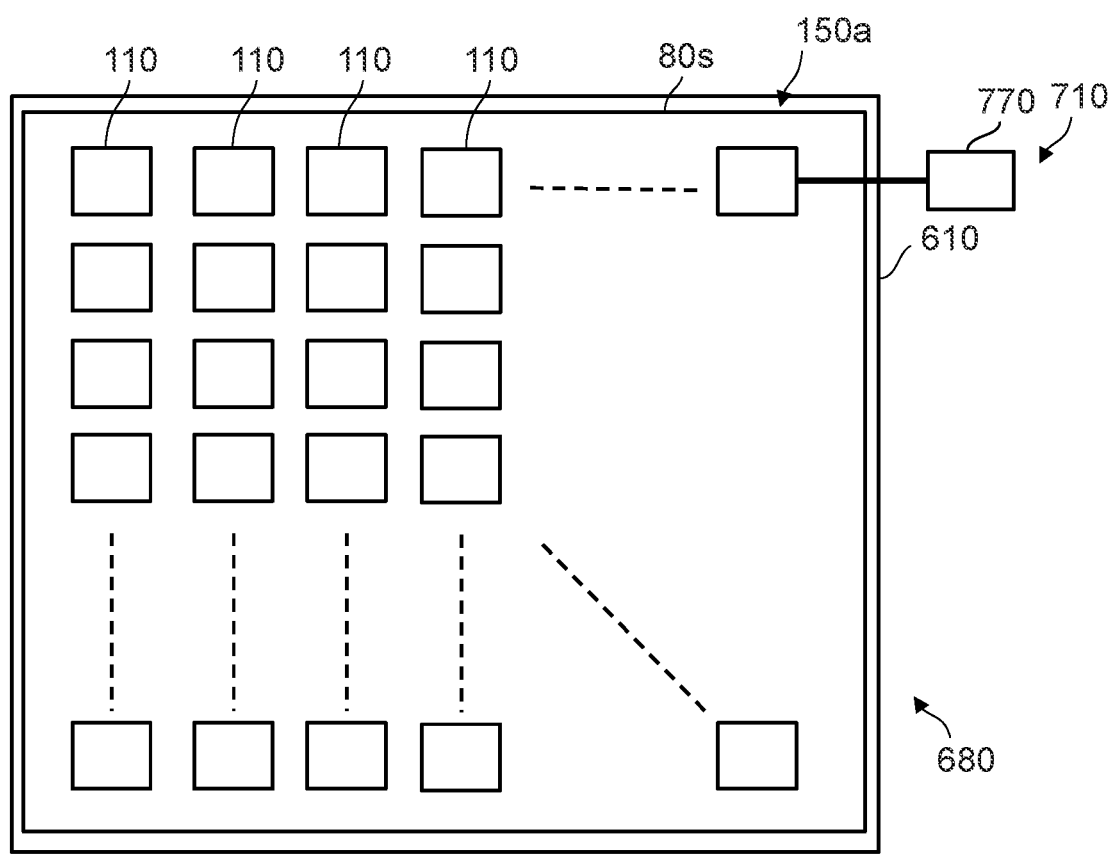
FIG. 17 is a schematic plan view showing the inspection device according to the second embodiment.

FIG. 17 is a schematic plan view showing the inspection device according to the second embodiment.

As shown in FIG. 17, the magnetic sensor 150a includes, for example, multiple magnetic sensors according to the embodiment. In the example, the magnetic sensor 150a includes multiple magnetic sensors (e.g., the magnetic sensor 110, etc.). For example, the multiple magnetic sensors are arranged along two directions. For example, the multiple magnetic sensors 110 are located on a base body.

The magnetic sensor 150a can detect a magnetic field generated by a current flowing in the inspection object 680 (which may be, for example, the battery 610). For example, an abnormal current flows in the battery 610 when the battery 610 approaches an abnormal state. The change of the state of the battery 610 can be known by the magnetic sensor 150a detecting the abnormal current. For example, the entire battery 610 can be inspected in a short period of time by moving the sensor array in two directions while the magnetic sensor 150a is placed proximate to the battery 610. The magnetic sensor 150a may be used to inspect the battery 610 in the manufacturing process of the battery 610.

Figure 18:
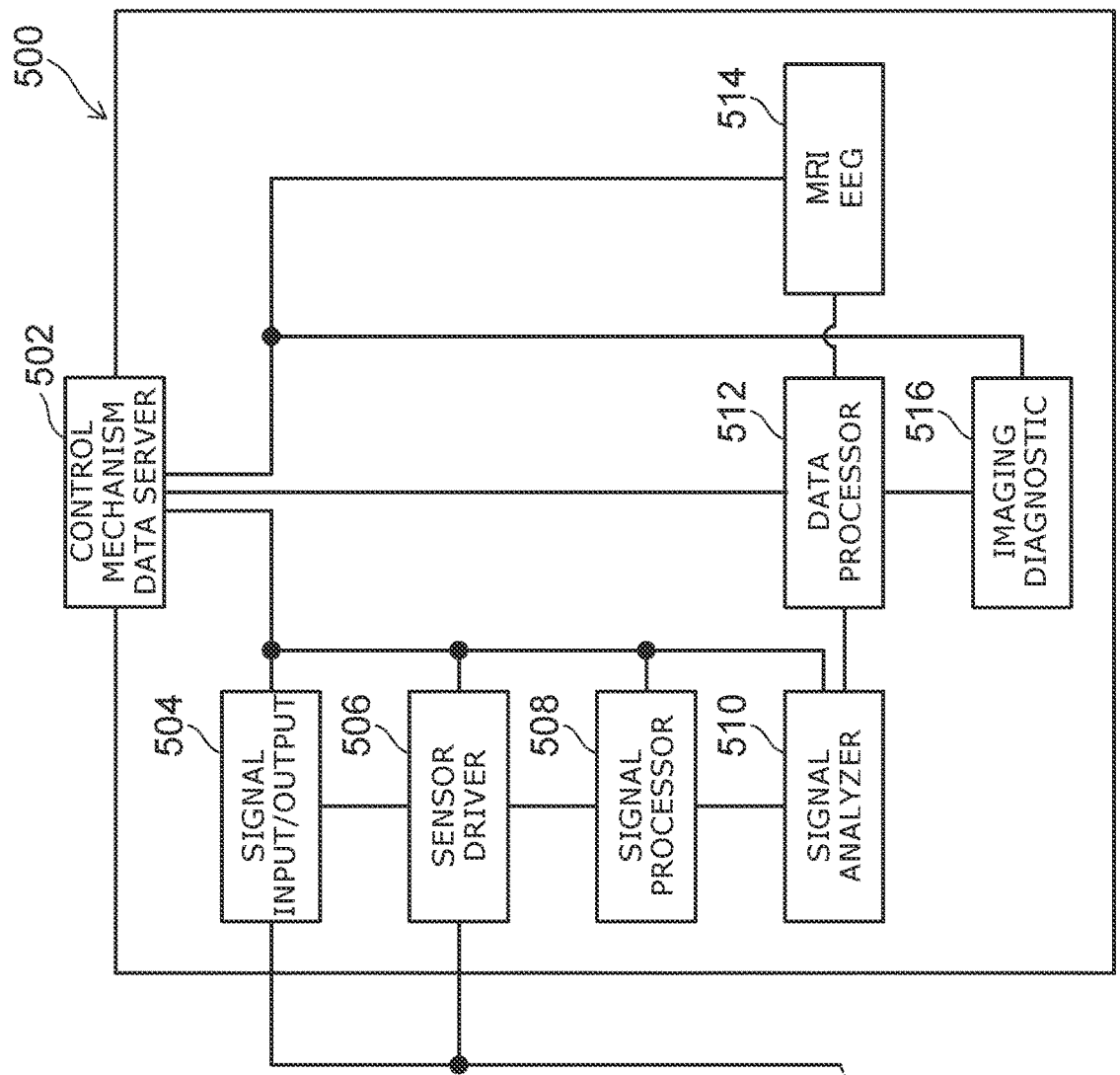
FIG. 18 is a schematic view showing the magnetic sensor and the inspection device according to the second embodiment.

For example, the magnetic sensor according to the embodiment is applicable to the inspection device 710 such as a diagnostic device, etc. FIG. 18 is a schematic view showing the magnetic sensor and the inspection device according to the second embodiment.

As shown in FIG. 18, the diagnostic device 500 is an example of the inspection device 710 and includes a magnetic sensor 150. The magnetic sensor 150 includes the magnetic sensor described in reference to the first embodiment and modifications of the magnetic sensor.

In the diagnostic device 500, the magnetic sensor 150 is, for example, a magnetoencephalography device. The magnetoencephalography device detects a magnetic field generated by cranial nerves. When the magnetic sensor 150 is included in a magnetoencephalography device, the size of the magnetic element included in the magnetic sensor 150 is, for example, not less than 1 mm but less than 10 mm. The size is, for example, the length including the MFC.

As shown in FIG. 18, the magnetic sensor 150 (the magnetoencephalography device) is mounted to, for example, the head of a human body. The magnetic sensor 150 (the magnetoencephalography device) includes a sensor part 301. The magnetic sensor 150 (the magnetoencephalography device) may include multiple sensor parts 301. The number of the multiple sensor parts 301 is, for example, about 100 (e.g., not less than 50 and not more than 150). The multiple sensor parts 301 are provided on a flexible base body 302.

The magnetic sensor 150 may include, for example, a circuit for differential detection, etc. The magnetic sensor 150 may include a sensor other than a magnetic sensor (e.g., a potential terminal, an acceleration sensor, etc.).

The size of the magnetic sensor 150 is small compared to the size of a conventional SQUID magnetic sensor. Therefore, the mounting of the multiple sensor parts 301 is easy. The mounting of the multiple sensor parts 301 and the other circuits is easy. The multiple sensor parts 301 and the other sensors can be easily mounted together.

The base body 302 may include, for example, an elastic body such as a silicone resin, etc. For example, the multiple sensor parts 301 are linked to each other and provided in the base body 302. For example, the base body 302 can be closely adhered to the head.

An input/output cord 303 of the sensor part 301 is connected with a sensor driver 506 and a signal input/output part 504 of the diagnostic device 500. A magnetic field measurement is performed in the sensor part 301 based on electrical power from the sensor driver 506 and a control signal from the signal input/output part 504. The result is input to the signal input/output part 504. The signal that is obtained by the signal input/output part 504 is supplied to a signal processor 508. Processing such as, for example, the removal of noise, filtering, amplification, signal calculation, etc., are performed in the signal processor 508. The signal that is processed by the signal processor 508 is supplied to a signal analyzer 510. For example, the signal analyzer 510 extracts a designated signal for magnetoencephalography. For example, signal analysis to match the signal phases is performed in the signal analyzer 510.

The output of the signal analyzer 510 (the data for which the signal analysis is finished) is supplied to a data processor 512. Data analysis is performed in the data processor 512. It is possible to include image data such as, for example, MRI (Magnetic Resonance Imaging), etc., in the data analysis. It is possible to include, for example, scalp potential information such as EEG (Electroencephalogram), etc., in the data analysis. For example, a data part 514 of the MRI, the EEG, etc., is connected with the data processor 512. For example, nerve firing point analysis, inverse analysis, or the like is performed by the data analysis.

For example, the result of the data analysis is supplied to an imaging diagnostic part 516. Imaging is performed by the imaging diagnostic part 516. The diagnosis is supported by the imaging.

For example, the series of operations described above is controlled by a control mechanism 502. For example, necessary data such as preliminary signal data, metadata partway through the data processing, or the like is stored in a data server. The data server and the control mechanism may be integrated.

The diagnostic device 500 according to the embodiment includes the magnetic sensor 150, and a processor that processes the output signal obtained from the magnetic sensor 150. The processor includes, for example, at least one of the signal processor 508 or the data processor 512. The processor includes, for example, a computer, etc.

In the magnetic sensor 150 shown in FIG. 18, the sensor part 301 is mounted to the head of a human body. The sensor part 301 may be mounted to the chest of the human body. Magnetocardiography is possible thereby. For example, the sensor part 301 may be mounted to the abdomen of a pregnant woman. Palmoscopy of the fetus can be performed thereby.

It is favorable for the magnetic sensor device including the participant to be mounted inside a shielded room. For example, the effects of geomagnetism or magnetic noise can be suppressed thereby.

For example, a mechanism may be provided to locally shield the sensor part 301 or the measurement section of the human body. For example, a shield mechanism may be provided in the sensor part 301. For example, the signal analysis or the data processing may be effectively shielded.

According to the embodiment, the base body 302 may be flexible or may be substantially not flexible. In the example shown in FIG. 18, the base body 302 is a continuous membrane that is patterned into a hat-like configuration. The base body 302 may have a net configuration. For example, a good fit is obtained thereby. For example, the adhesion of the base body 302 to the human body is improved. The base body 302 may have a hard helmet-like configuration.

Figure 19:
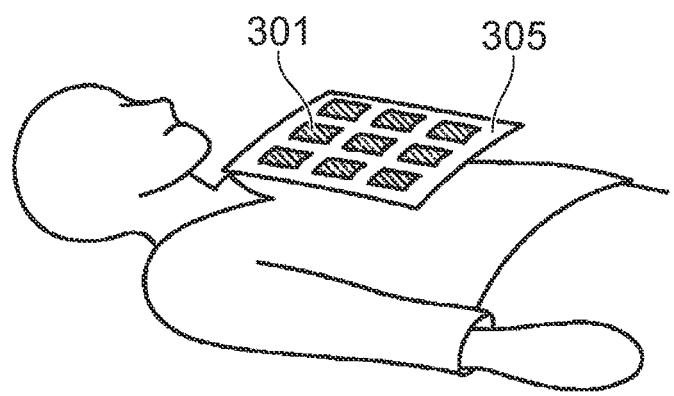
FIG. 19 is a schematic view showing the inspection device according to the second embodiment.

FIG. 19 is a schematic view showing the inspection device according to the second embodiment.

FIG. 19 is an example of a magnetocardiography device. In the example shown in FIG. 19, the sensor part 301 is provided on a hard base body 305 having a flat plate shape.

The input and output of the signal obtained from the sensor part 301 in the example shown in FIG. 19 are similar to the input and output described with reference to FIG. 18.

The processing of the signal obtained from the sensor part 301 in the example shown in FIG. 19 is similar to the processing described with reference to FIG. 18.

There is a reference example in which a SQUID (Superconducting Quantum Interference Device) magnetic sensor is used as a device to measure a faint magnetic field such as a magnetic field emitted from a living body, etc. Because superconductivity is used in the reference example, the device is large; and the power consumption is large. The load on the measurement object (the patient) is large.

According to the embodiment, the device can be small.

The power consumption can be suppressed. The load on the measurement object (the patient) can be reduced. According to the embodiment, the SN ratio of the magnetic field detection can be improved. The sensitivity can be increased.

Embodiments may include the following configurations (e.g., technological proposals).

Configuration 1

A magnetic sensor, comprising:

a base body including a base body end portion;

a magnetic member, a direction from the base body toward the magnetic member being along a first direction; and an element part, the element part including a first magnetic element and a second magnetic element, a position of the first magnetic element and a position of the second magnetic element in a second direction being between a position of the base body end portion in the second direction and a position of the magnetic member in the second direction, the second direction crossing the first direction, a first distance along the second direction between the base body end portion and the element part being greater than a second distance along the second direction between the element part and the magnetic member.

Configuration 2

The magnetic sensor according to Configuration 1, wherein the first distance is not less than 2 times the second distance.

Configuration 3

The magnetic sensor according to Configuration 1 or 2, wherein the first distance is not more than 100 times the second distance.

Configuration 4

The magnetic sensor the magnetic sensor according to Configuration 1 or 2, wherein the second distance is not more than 50 μm.

Configuration 5

The magnetic sensor according to any one of Configurations 1 to 4, wherein a length along a third direction of the first magnetic element is greater than a length along the second direction of the first magnetic element, the third direction crosses a plane including the first and second directions, and a length along the third direction of the second magnetic element is greater than a length along the second direction of the second magnetic element.

Configuration 6

The magnetic sensor according to any one of Configurations 1 to 5, wherein the element part further includes a conductive member, a first current that includes an alternating current component can flow in the conductive member, and
the conductive member includes:
a first corresponding portion overlapping the first magnetic element in the first direction; and
a second corresponding portion overlapping the second magnetic element in the first direction.

Configuration 7

The magnetic sensor according to any one of Configurations 1 to 5, wherein
the element part further includes a third magnetic element and a fourth magnetic element,
a direction from the first magnetic element toward the third magnetic element is along the second direction, and
a direction from the first magnetic element toward the fourth magnetic element is along the second direction.

Configuration 8

The magnetic sensor according to Configuration 7, wherein
the element part further includes a conductive member,
a first current that includes an alternating current component can flow in the conductive member, and
the conductive member includes:
a first corresponding portion overlapping the first magnetic element in the first direction;
a second corresponding portion overlapping the second magnetic element in the first direction;
a third corresponding portion overlapping the third magnetic element in the first direction; and
a fourth corresponding portion overlapping the fourth magnetic element in the first direction.

Configuration 9

The magnetic sensor according to Configuration 8, wherein
an other end portion of the first magnetic element is electrically connected with one end portion of the second magnetic element,
one end portion of the first magnetic element is electrically connected with one end portion of the third magnetic element,
an other end portion of the third magnetic element is electrically connected with one end portion of the fourth magnetic element,
an other end portion of the second magnetic element is electrically connected with an other end portion of the fourth magnetic element,
the first corresponding portion includes:
a first corresponding one-portion corresponding to the one end portion of the first magnetic element; and
a first corresponding other-portion corresponding to the other end portion of the first magnetic element,
the second corresponding portion includes:
a second corresponding one-portion corresponding to the one end portion of the second magnetic element; and
a second corresponding other-portion corresponding to the other end portion of the second magnetic element,
the third corresponding portion includes:
a third corresponding one-portion corresponding to the one end portion of the third magnetic element; and
a third corresponding other-portion corresponding to the other end portion of the third magnetic element,
the fourth corresponding portion includes:
a fourth corresponding one-portion corresponding to the one end portion of the fourth magnetic element; and
a fourth corresponding other-portion corresponding to the other end portion of the fourth magnetic element, at a first time at which the first current including the alternating current component is supplied to the conductive member:
an element current flows through the first magnetic element in an orientation from the one end portion of the first magnetic element toward the other end portion of the first magnetic element;
the element current flows through the second magnetic element in an orientation from the one end portion of the second magnetic element toward the other end portion of the second magnetic element;
the element current flows through the third magnetic element in an orientation from the one end portion of the third magnetic element toward the other end portion of the third magnetic element;
the element current flows through the fourth magnetic element in an orientation from the one end portion of the fourth magnetic element toward the other end portion of the fourth magnetic element;
the first current flows through the first corresponding portion in an orientation from the first corresponding other-portion toward the first corresponding one-portion;
the first current flows through the second corresponding portion in an orientation from the second corresponding one-portion toward the second corresponding other-portion;
the first current flows through the third corresponding portion in an orientation from the third corresponding one-portion toward the third corresponding other-portion; and
the first current flows through the fourth corresponding portion in an orientation from the fourth corresponding other-portion toward the fourth corresponding one-portion.

Configuration 10

The magnetic sensor according to Configuration 8, wherein
an other end portion of the first magnetic element is electrically connected with one end portion of the second magnetic element,
one end portion of the first magnetic element is electrically connected with one end portion of the third magnetic element,
an other end portion of the third magnetic element is electrically connected with one end portion of the fourth magnetic element,
an other end portion of the second magnetic element is electrically connected with an other end portion of the fourth magnetic element,
the first corresponding portion includes:
a first corresponding one-portion overlapping the one end portion of the first magnetic element in the first direction; and
a first corresponding other-portion overlapping the other end portion of the first magnetic element in the first direction,
the second corresponding portion includes:
a second corresponding one-portion overlapping the one end portion of the second magnetic element in the first direction; and
a second corresponding other-portion overlapping the other end portion of the second magnetic element in the first direction,
the third corresponding portion includes:

a third corresponding one-portion overlapping the one end portion of the third magnetic element in the first direction; and a third corresponding other-portion overlapping the other end portion of the third magnetic element in the first direction, the fourth corresponding portion includes:

a fourth corresponding one-portion overlapping the one end portion of the fourth magnetic element in the first direction; and a fourth corresponding other-portion overlapping the other end portion of the fourth magnetic element in the first direction, the first corresponding one-portion is electrically connected with the third corresponding one-portion, the first corresponding other-portion is electrically connected with the second corresponding one-portion, the third corresponding other-portion is electrically connected with the fourth corresponding one-portion, and the second corresponding other-portion is electrically connected with the fourth corresponding other-portion.

Configuration 11

The magnetic sensor according to Configuration 10, further comprising:

a first current circuit, the first current circuit being configured to supply the first current between a fifth connection point and a sixth connection point, the first current including an alternating current, the fifth connection point being between the first corresponding other-portion and the second corresponding one-portion, the sixth connection point being between the third corresponding other-portion and the fourth corresponding one-portion.

Configuration 12

The magnetic sensor according to Configuration 8, wherein an other end portion of the first magnetic element is electrically connected with one end portion of the second magnetic element, one end portion of the first magnetic element is electrically connected with one end portion of the third magnetic element, an other end portion of the third magnetic element is electrically connected with one end portion of the fourth magnetic element, an other end portion of the second magnetic element is electrically connected with an other end portion of the fourth magnetic element, the first corresponding portion includes:

a first corresponding one-portion overlapping the one end portion of the first magnetic element in the first direction; and a first corresponding other-portion overlapping the other end portion of the first magnetic element in the first direction, the second corresponding portion includes:

a second corresponding one-portion overlapping the one end portion of the second magnetic element in the first direction; and a second corresponding other-portion overlapping the other end portion of the second magnetic element in the first direction, the third corresponding portion includes:

a third corresponding one-portion overlapping the one end portion of the third magnetic element in the first direction; and a third corresponding other-portion overlapping the other end portion of the third magnetic element in the first direction, the fourth corresponding portion includes:

a fourth corresponding one-portion overlapping the one end portion of the fourth magnetic element in the first direction; and a fourth corresponding other-portion overlapping the other end portion of the fourth magnetic element in the first direction, the first corresponding one-portion is electrically connected with the second corresponding other-portion, the first corresponding other-portion is electrically connected with the second corresponding one-portion, the third corresponding one-portion is electrically connected with the fourth corresponding other-portion, and the third corresponding other-portion is electrically connected with the fourth corresponding one-portion.

Configuration 13

The magnetic sensor according to Configuration 12, further comprising:

a first current circuit, the first current circuit being configured to supply the first current between a fifth connection point and a seventh connection point and between a sixth connection point and the seventh connection point, the first current including an alternating current, the fifth connection point being between the first corresponding other-portion and the second corresponding one-portion, the seventh connection point being between the first corresponding one-portion and the second corresponding other-portion, the sixth connection point being between the third corresponding other-portion and the fourth corresponding one-portion, the seventh connection point being between the third corresponding one-portion and the fourth corresponding other-portion.

Configuration 14

The magnetic sensor according to Configuration 8, wherein an other end portion of the first magnetic element is electrically connected with one end portion of the second magnetic element, one end portion of the first magnetic element is electrically connected with one end portion of the third magnetic element, an other end portion of the third magnetic element is electrically connected with one end portion of the fourth magnetic element, an other end portion of the second magnetic element is electrically connected with an other end portion of the fourth magnetic element, the first corresponding portion includes:

a first corresponding one-portion overlapping the one end portion of the first magnetic element in the first direction; and a first corresponding other-portion overlapping the other end portion of the first magnetic element in the first direction, the second corresponding portion includes:

a second corresponding one-portion overlapping the one end portion of the second magnetic element in the first direction; and a second corresponding other-portion overlapping the other end portion of the second magnetic element in the first direction, the third corresponding portion includes:

a third corresponding one-portion overlapping the one end portion of the third magnetic element in the first direction; and a third corresponding other-portion overlapping the other end portion of the third magnetic element in the first direction, the fourth corresponding portion includes:

a fourth corresponding one-portion overlapping the one end portion of the fourth magnetic element in the first direction; and a fourth corresponding other-portion overlapping the other end portion of the fourth magnetic element in the first direction, the first corresponding one-portion is electrically connected with the fourth corresponding other-portion, the first corresponding other-portion is electrically connected with the second corresponding one-portion, the second corresponding other-portion is electrically connected with the third corresponding one-portion, and the third corresponding other-portion is electrically connected with the fourth corresponding one-portion.

Configuration 15

The magnetic sensor according to Configuration 14, further comprising:

a first current circuit, the first current circuit being configured to supply the first current between an eighth connection point and a ninth connection point, the first current including an alternating current, the eighth connection point being between the first corresponding one-portion and the fourth corresponding other-portion, the ninth connection point being between the second corresponding other-portion and the third corresponding one-portion.

Configuration 16

The magnetic sensor according to any one of Configurations 10 to 15, further comprising:

an element current circuit, the element current circuit being configured to supply an element current between a first connection point and a second connection point, the first connection point being between the one end portion of the first magnetic element and the one end portion of the third magnetic element, the second connection point being between the other end portion of the second magnetic element and the other end portion of the fourth magnetic element.

Configuration 17

The magnetic sensor according to Configuration 16, further comprising:

a detection circuit, the detection circuit being configured to detect a change of a potential between a third connection point and a fourth connection point, the third connection point being between the other end portion of the first magnetic element and the one end portion of the second magnetic element, the fourth connection point being between the other end portion of the third magnetic element and the one end portion of the fourth magnetic element.

Configuration 18

The magnetic sensor according to any one of Configurations 1 to 17, wherein the first magnetic element overlaps the magnetic member in the second direction.

Configuration 19

The magnetic sensor according to any one of Configurations 1 to 18, wherein the first magnetic element includes:

a first magnetic layer;

a first counter magnetic layer; and a first nonmagnetic layer located between the first magnetic layer and the first counter magnetic layer in the first direction.

Configuration 20

An inspection device, comprising:

the magnetic sensor according to any one of Configurations 1 to 19; and a processor configured to process a signal output from the magnetic sensor.

According to embodiments, a magnetic sensor and an inspection device can be provided in which the sensitivity can be increased.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic sensors such as magnetic layers, nonmagnetic layers, magnetic members, conductive members, circuits, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic sensors, and inspection devices practicable by an appropriate design modification by one skilled in the art based on the magnetic sensors, and the inspection devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic sensor, comprising:
a base body including a base body end portion;
a magnetic member, a direction from the base body toward the magnetic member being along a first direction; and
an element part,
the element part including a first magnetic element and a second magnetic element,
a position of the first magnetic element and a position of the second magnetic element in a second direction being between a position of the base body end portion in the second direction and a position of the magnetic member in the second direction,
the second direction crossing the first direction,
a first distance along the second direction between the base body end portion and the element part being greater than a second distance along the second direction between the element part and the magnetic member.

2. The sensor according to claim 1, wherein the first distance is not less than 2 times the second distance.

3. The sensor according to claim 1, wherein the first distance is not more than 100 times the second distance.

4. The sensor according to claim 1, wherein the second distance is not more than 50 μm.

5. The sensor according to claim 1, wherein
a length along a third direction of the first magnetic element is greater than a length along the second direction of the first magnetic element,
the third direction crosses a plane including the first and second directions, and
a length along the third direction of the second magnetic element is greater than a length along the second direction of the second magnetic element.

6. The sensor according to claim 1, wherein
the element part further includes a conductive member,
a first current that includes an alternating current component can flow in the conductive member, and
the conductive member includes:
a first corresponding portion overlapping the first magnetic element in the first direction; and
a second corresponding portion overlapping the second magnetic element in the first direction.

7. The sensor according to claim 1, wherein
the first magnetic element overlaps the magnetic member in the second direction.

8. The sensor according to claim 1, wherein
the first magnetic element includes:
a first magnetic layer;
a first counter magnetic layer; and
a first nonmagnetic layer located between the first magnetic layer and the first counter magnetic layer in the first direction.

9. An inspection device, comprising:
the magnetic sensor according to claim 1; and
a processor configured to process a signal output from the magnetic sensor.

10. The sensor according to claim 1, wherein
the element part further includes a third magnetic element and a fourth magnetic element,
a direction from the first magnetic element toward the third magnetic element is along the second direction, and
a direction from the first magnetic element toward the fourth magnetic element is along the second direction.

11. The sensor according to claim 10, wherein
the element part further includes a conductive member,
a first current that includes an alternating current component can flow in the conductive member, and
the conductive member includes:
a first corresponding portion overlapping the first magnetic element in the first direction;
a second corresponding portion overlapping the second magnetic element in the first direction;
a third corresponding portion overlapping the third magnetic element in the first direction; and
a fourth corresponding portion overlapping the fourth magnetic element in the first direction.

12. The sensor according to claim 11, wherein
an other end portion of the first magnetic element is electrically connected with one end portion of the second magnetic element,
one end portion of the first magnetic element is electrically connected with one end portion of the third magnetic element,
an other end portion of the third magnetic element is electrically connected with one end portion of the fourth magnetic element,
an other end portion of the second magnetic element is electrically connected with an other end portion of the fourth magnetic element,
the first corresponding portion includes:
a first corresponding one-portion corresponding to the one end portion of the first magnetic element; and
a first corresponding other-portion corresponding to the other end portion of the first magnetic element,
the second corresponding portion includes:
a second corresponding one-portion corresponding to the one end portion of the second magnetic element; and
a second corresponding other-portion corresponding to the other end portion of the second magnetic element,
the third corresponding portion includes:
a third corresponding one-portion corresponding to the one end portion of the third magnetic element; and
a third corresponding other-portion corresponding to the other end portion of the third magnetic element,
the fourth corresponding portion includes:
a fourth corresponding one-portion corresponding to the one end portion of the fourth magnetic element; and
a fourth corresponding other-portion corresponding to the other end portion of the fourth magnetic element,
at a first time at which the first current including the alternating current component is supplied to the conductive member:
an element current flows through the first magnetic element in an orientation from the one end portion of the first magnetic element toward the other end portion of the first magnetic element;
the element current flows through the second magnetic element in an orientation from the one end portion of the second magnetic element toward the other end portion of the second magnetic element;
the element current flows through the third magnetic element in an orientation from the one end portion of the third magnetic element toward the other end portion of the third magnetic element;

the element current flows through the fourth magnetic element in an orientation from the one end portion of the fourth magnetic element toward the other end portion of the fourth magnetic element;

the first current flows through the first corresponding portion in an orientation from the first corresponding other-portion toward the first corresponding one-portion;

the first current flows through the second corresponding portion in an orientation from the second corresponding one-portion toward the second corresponding other-portion;

the first current flows through the third corresponding portion in an orientation from the third corresponding one-portion toward the third corresponding other-portion; and the first current flows through the fourth corresponding portion in an orientation from the fourth corresponding other-portion toward the fourth corresponding one-portion.

13. The sensor according to claim 11, wherein
an other end portion of the first magnetic element is electrically connected with one end portion of the second magnetic element,
one end portion of the first magnetic element is electrically connected with one end portion of the third magnetic element,
an other end portion of the third magnetic element is electrically connected with one end portion of the fourth magnetic element,
an other end portion of the second magnetic element is electrically connected with an other end portion of the fourth magnetic element,
the first corresponding portion includes:
  a first corresponding one-portion overlapping the one end portion of the first magnetic element in the first direction; and
  a first corresponding other-portion overlapping the other end portion of the first magnetic element in the first direction,
the second corresponding portion includes:
  a second corresponding one-portion overlapping the one end portion of the second magnetic element in the first direction; and
  a second corresponding other-portion overlapping the other end portion of the second magnetic element in the first direction,
the third corresponding portion includes:
  a third corresponding one-portion overlapping the one end portion of the third magnetic element in the first direction; and
  a third corresponding other-portion overlapping the other end portion of the third magnetic element in the first direction,
the fourth corresponding portion includes:
  a fourth corresponding one-portion overlapping the one end portion of the fourth magnetic element in the first direction; and
  a fourth corresponding other-portion overlapping the other end portion of the fourth magnetic element in the first direction,
the first corresponding one-portion is electrically connected with the second corresponding other-portion,
the first corresponding other-portion is electrically connected with the second corresponding one-portion,
the third corresponding one-portion is electrically connected with the fourth corresponding other-portion, and
the third corresponding other-portion is electrically connected with the fourth corresponding one-portion.

14. The sensor according to claim 13, further comprising:
a first current circuit,
the first current circuit being configured to supply the first current between a fifth connection point and a seventh connection point and between a sixth connection point and the seventh connection point,
the first current including an alternating current,
the fifth connection point being between the first corresponding other-portion and the second corresponding one-portion,
the seventh connection point being between the first corresponding one-portion and the second corresponding other-portion,
the sixth connection point being between the third corresponding other-portion and the fourth corresponding one-portion,
the seventh connection point being between the third corresponding one-portion and the fourth corresponding other-portion.

15. The sensor according to claim 11, wherein
an other end portion of the first magnetic element is electrically connected with one end portion of the second magnetic element,
one end portion of the first magnetic element is electrically connected with one end portion of the third magnetic element,
an other end portion of the third magnetic element is electrically connected with one end portion of the fourth magnetic element,
an other end portion of the second magnetic element is electrically connected with an other end portion of the fourth magnetic element,
the first corresponding portion includes:
  a first corresponding one-portion overlapping the one end portion of the first magnetic element in the first direction; and
  a first corresponding other-portion overlapping the other end portion of the first magnetic element in the first direction,
the second corresponding portion includes:
  a second corresponding one-portion overlapping the one end portion of the second magnetic element in the first direction; and
  a second corresponding other-portion overlapping the other end portion of the second magnetic element in the first direction,
the third corresponding portion includes:
  a third corresponding one-portion overlapping the one end portion of the third magnetic element in the first direction; and
  a third corresponding other-portion overlapping the other end portion of the third magnetic element in the first direction,
the fourth corresponding portion includes:
  a fourth corresponding one-portion overlapping the one end portion of the fourth magnetic element in the first direction; and
  a fourth corresponding other-portion overlapping the other end portion of the fourth magnetic element in the first direction,
the first corresponding one-portion is electrically connected with the fourth corresponding other-portion, the first corresponding other-portion is electrically connected with the second corresponding one-portion, the second corresponding other-portion is electrically connected with the third corresponding one-portion, and the third corresponding other-portion is electrically connected with the fourth corresponding one-portion.

16. The sensor according to claim 15, further comprising:

a first current circuit, the first current circuit being configured to supply the first current between an eighth connection point and a ninth connection point, the first current including an alternating current, the eighth connection point being between the first corresponding one-portion and the fourth corresponding other-portion, the ninth connection point being between the second corresponding other-portion and the third corresponding one-portion.

17. The sensor according to claim 11, wherein an other end portion of the first magnetic element is electrically connected with one end portion of the second magnetic element, one end portion of the first magnetic element is electrically connected with one end portion of the third magnetic element, an other end portion of the third magnetic element is electrically connected with one end portion of the fourth magnetic element, an other end portion of the second magnetic element is electrically connected with an other end portion of the fourth magnetic element, the first corresponding portion includes:
 a first corresponding one-portion overlapping the one end portion of the first magnetic element in the first direction; and
 a first corresponding other-portion overlapping the other end portion of the first magnetic element in the first direction, the second corresponding portion includes:
 a second corresponding one-portion overlapping the one end portion of the second magnetic element in the first direction; and
 a second corresponding other-portion overlapping the other end portion of the second magnetic element in the first direction, the third corresponding portion includes:
 a third corresponding one-portion overlapping the one end portion of the third magnetic element in the first direction; and
 a third corresponding other-portion overlapping the other end portion of the third magnetic element in the first direction, the fourth corresponding portion includes:
 a fourth corresponding one-portion overlapping the one end portion of the fourth magnetic element in the first direction; and
 a fourth corresponding other-portion overlapping the other end portion of the fourth magnetic element in the first direction, the first corresponding one-portion is electrically connected with the third corresponding one-portion, the first corresponding other-portion is electrically connected with the second corresponding one-portion, the third corresponding other-portion is electrically connected with the fourth corresponding one-portion, and the second corresponding other-portion is electrically connected with the fourth corresponding other-portion.

18. The sensor according to claim 17, further comprising:

a first current circuit, the first current circuit being configured to supply the first current between a fifth connection point and a sixth connection point, the first current including an alternating current, the fifth connection point being between the first corresponding other-portion and the second corresponding one-portion, the sixth connection point being between the third corresponding other-portion and the fourth corresponding one-portion.

19. The sensor according to claim 17, further comprising:

an element current circuit, the element current circuit being configured to supply an element current between a first connection point and a second connection point, the first connection point being between the one end portion of the first magnetic element and the one end portion of the third magnetic element, the second connection point being between the other end portion of the second magnetic element and the other end portion of the fourth magnetic element.

20. The sensor according to claim 19, further comprising:

a detection circuit, the detection circuit being configured to detect a change of a potential between a third connection point and a fourth connection point, the third connection point being between the other end portion of the first magnetic element and the one end portion of the second magnetic element, the fourth connection point being between the other end portion of the third magnetic element and the one end portion of the fourth magnetic element.

* * * * *